United States Patent
Yamada et al.

(10) Patent No.: US 10,481,488 B2
(45) Date of Patent: *Nov. 19, 2019

(54) MASK BLANK SUBSTRATE PROCESSING DEVICE, MASK BLANK SUBSTRATE PROCESSING METHOD, MASK BLANK SUBSTRATE FABRICATION METHOD, MASK BLANK FABRICATION METHOD, AND TRANSFER MASK FABRICATION METHOD

(71) Applicant: HOYA CORPORATION, Tokyo (JP)

(72) Inventors: Takeyuki Yamada, Tokyo (JP); Toshihiko Orihara, Tokyo (JP); Takahito Nishimura, Tokyo (JP)

(73) Assignee: HOYA CORPORATION, Tokyo (JP)

( * ) Notice: Subject to any disclaimer, the term of this patent is extended or adjusted under 35 U.S.C. 154(b) by 291 days.

This patent is subject to a terminal disclaimer.

(21) Appl. No.: 14/654,753

(22) PCT Filed: Dec. 24, 2013

(86) PCT No.: PCT/JP2013/084470
§ 371 (c)(1),
(2) Date: Jun. 22, 2015

(87) PCT Pub. No.: WO2014/104009
PCT Pub. Date: Jul. 3, 2014

(65) Prior Publication Data
US 2015/0370160 A1     Dec. 24, 2015

(30) Foreign Application Priority Data
Dec. 27, 2012  (JP) .................................. 2012-285279

(51) Int. Cl.
*G03F 1/60*  (2012.01)
*G03F 1/24*  (2012.01)
(Continued)

(52) U.S. Cl.
CPC ................ *G03F 1/60* (2013.01); *B24B 29/02* (2013.01); *C03C 15/00* (2013.01);
(Continued)

(58) Field of Classification Search
CPC ..... G03F 1/24; G03F 1/60; G03F 1/80; G03F 1/82; C03C 23/0075; B24C 1/08; B04C 3/10
(Continued)

(56) References Cited

U.S. PATENT DOCUMENTS

2002/0022184 A1* 2/2002 Tanaka ...................... G03F 1/72
430/5
2006/0254611 A1* 11/2006 Koster ...................... G03F 1/82
134/1

(Continued)

FOREIGN PATENT DOCUMENTS

JP          3879827 A    7/2003
JP     2006-035413 A    2/2006
(Continued)

OTHER PUBLICATIONS

International Search Report for PCT/JP2013/084470 dated Apr. 1, 2014 [PCT/ISA/210].
(Continued)

*Primary Examiner* — Binh X Tran
(74) *Attorney, Agent, or Firm* — Kilpatrick Townsend & Stockton LLP

(57) ABSTRACT

Provided are a mask blank substrate processing device, a mask blank substrate processing method, a mask blank substrate fabrication method, a mask blank fabrication method, and a transfer mask fabrication method, for surface processing a mask blank substrate such that a high-level smoothness and a low-defect quality are satisfied. A mask blank substrate processing device (1) comprises: substrate
(Continued)

support means (3) for supporting a substrate (Y); a catalytic surface plate (4) comprising a catalytic face (4a) which is positioned opposite the principal surface of the substrate (Y); relative movement means (5) for causing the catalytic face (4a) and the principal surface to move relative to each other in a state of being either in contact or in close proximity; first processing fluid supply means (6) which supplies a first processing fluid for CARE to the principal surface; and physical cleaning means (7) for removing foreign matter which has adhered to the principal surface from the principal surface, using a physical action.

19 Claims, 4 Drawing Sheets

(51) Int. Cl.
*G03F 1/82* (2012.01)
*C03C 15/00* (2006.01)
*C03C 23/00* (2006.01)
*B24B 29/02* (2006.01)
*G03F 1/80* (2012.01)

(52) U.S. Cl.
CPC ............ *C03C 23/0075* (2013.01); *G03F 1/24* (2013.01); *G03F 1/80* (2013.01); *G03F 1/82* (2013.01)

(58) Field of Classification Search
USPC ........................................ 216/83, 88, 90, 92
See application file for complete search history.

(56) References Cited

U.S. PATENT DOCUMENTS

| | | | |
|---|---|---|---|
| 2009/0095712 A1* | 4/2009 | Yamauchi | H01L 21/02019 216/53 |
| 2010/0147463 A1 | 6/2010 | Yamauchi et al. | |
| 2011/0159785 A1 | 6/2011 | Harada et al. | |
| 2012/0276474 A1* | 11/2012 | Yamauchi | G03F 1/82 430/5 |
| 2013/0115774 A1 | 5/2013 | Kodera et al. | |
| 2014/0038090 A1* | 2/2014 | Lu | G03F 1/52 430/5 |
| 2014/0326612 A1* | 11/2014 | Yamauchi | B24B 37/046 205/766 |
| 2014/0329174 A1 | 11/2014 | Hamamoto et al. | |
| 2015/0017574 A1 | 1/2015 | Orihara et al. | |
| 2015/0355537 A1* | 12/2015 | Yamada | G03F 1/50 430/5 |

FOREIGN PATENT DOCUMENTS

| | | |
|---|---|---|
| JP | 2006-226733 A | 8/2006 |
| JP | 3879828 A | 2/2007 |
| JP | 2007-283410 A | 11/2007 |
| JP | 2008-071857 A | 3/2008 |
| JP | 2008-121099 A | 5/2008 |
| JP | 2008-136983 A | 6/2008 |
| JP | 2009-117782 A | 5/2009 |
| JP | 2011-136388 A | 7/2011 |
| JP | 2011-192693 A | 9/2011 |
| JP | 2013-102090 A | 5/2013 |
| WO | 2013/146990 A1 | 10/2013 |
| WO | 2013/146991 A1 | 10/2013 |

OTHER PUBLICATIONS

Communication dated May 23, 2017 from the Japanese Patent Office in counterpart application No. 2016-147129.

* cited by examiner

MASK BLANK SUBSTRATE PROCESSING DEVICE, MASK BLANK SUBSTRATE PROCESSING METHOD, MASK BLANK SUBSTRATE FABRICATION METHOD, MASK BLANK FABRICATION METHOD, AND TRANSFER MASK FABRICATION METHOD

CROSS REFERENCE TO RELATED APPLICATIONS

This application is a National Stage of International Application No. PCT/JP2013/084470 filed Dec. 24, 2013, claiming priority based on Japanese Patent Application No. 2012-285279 filed Dec. 27, 2012, the contents of all of which are incorporated herein by reference in their entirety.

TECHNICAL FIELD

This invention relates to a mask blank substrate processing device, a mask blank substrate processing method, a mask blank substrate fabrication method, a fabrication method of a mask blank using the substrate, and a fabrication method of a transfer mask using the mask blank for reducing microscopic defects remaining on a polished surface of a mask blank substrate and for obtaining a desired smoothness.

BACKGROUND

Due to the recent development for high density and high precision of highly integrated circuits such as super-LSI devices, the requirements for smoothness and low-defect quality of a substrate for electronic devices such as a mask blank substrate are becoming stricter year by year.

Some known examples of conventional methods for reducing surface roughness of a principal surface of a glass substrate for a mask blank to enhance smoothness and low-defect quality include a method in which a principal surface of a synthetic quartz glass substrate is cleaned with low concentration hydrofluoric acid solution after precision polishing of the principal surface using a polishing liquid containing polishing grain including oxides such as colloidal silica, or before forming a film on the principal surface (Patent Document 1), a method of processing with a low concentration hydrofluoric acid solution followed by cleaning with alkaline liquid (Patent Document 2), and a method in which a surface of a glass substrate is polished using a double side polishing device with polishing slurry containing colloidal silica, followed by cleaning with sulfuric acid/hydrogen peroxide/water mixture (Patent Document 3).

Recently, further shortening of wavelength of exposure wavelength is in progress to cope with the requirement for more minute patterning of highly integrated circuits such as super-LSI devices as mentioned above. Particularly, development is in progress for reflective mask blanks for EUV exposure using Extreme Ultra Violet (hereafter referred to as EUV) light with a wavelength of about 0.2 to 100 nm as an exposure light.

However, in cases where, for example, ArF laser light (wavelength 193 nm) is used as an exposure light, there is a disadvantage that even a negligible defect, e.g., a minute defect around 30 nm, may cause a problem in a mask blank for EUV exposure using EUV light of, e.g., exposure wavelength of 13.5 nm with a minute defect greater than the exposure wavelength.

Based on the above, a substrate process is being developed so as to prevent a defect of such a critical size from remaining on the principal surface of the mask blank substrate.

On the other hand, development for high sensitivity is in progress on defect inspection devices for inspecting microscopic defects of the above size. Particularly, when the defect inspection criterion is enlarged to more minute defects in a defect inspection device for bright-field illumination, a false defect problem may occur which detects a background noise caused by a surface roughness of the substrate principal surface as a defect.

Therefore, smoothness of 0.08 nm or below at Rms (root mean square surface roughness) is demanded for a mask blank substrate for EUV exposure.

Recently, Catalyst Referred Etching (also referred to as CARE) method has been suggested (Patent Document 4).

The CARE method is conducted by causing a principal surface of a crystalline substrate such as SiC and a catalyst to be close to, or in contact with each other with a processing liquid such as an acidic liquid therebetween, and using active species produced from molecules in the processing liquid adsorbed to the catalyst, selectively removing, by mechanical processing and polishing, microscopic protrusions (machining-affected layer) generated as a crystal defect on the principal surface, to thereby achieve flattening and smoothening of the principal surface.

PRIOR ART DOCUMENTS

Patent Documents

[Patent Document 1]
  Japan Patent No. 3879827
[Patent Document 2]
  Japan Patent No. 3879828
[Patent Document 3]
  Japanese Patent Application Publication 2006-35413
[Patent Document 4]
  Japanese Patent Application Publication 2009-117782

SUMMARY OF THE INVENTION

However, the methods disclosed in Patent Documents 1 and 2 do not assume their application to apply surface processing on a principal surface of a mask blank substrate for EUV exposure as stated above. Even if the methods were actually applied, it is difficult to satisfy the requirement of high smoothness as mentioned above. Further, since the method disclosed in Patent Document 3 is a substrate processing method using a double side polishing device, there is a limitation in smoothing so that application of this method on surface processing of a principal surface of a mask blank substrate for EUV exposure is also difficult.

Further, when the CARE method as described in Patent Document 4 is employed as a mask blank substrate processing method, it is difficult to obtain a mask blank substrate for EUV exposure, for example, which simultaneously achieves high-level smoothness of 0.08 nm or below at Rms (root mean square surface roughness) and low-defect quality (quality of a level in which a defect greater than exposure light wavelength does not occur).

Furthermore, in cases where, for example, a $SiO_2$—$TiO_2$ glass was used as a substrate material, when an acidic liquid is used for the processing liquid in the CARE method on the substrate being made of a mixed crystal of $SiO_2$ and $TiO_2$, the acidic liquid causes titanium (Ti) on the substrate surface to selectively dissolve so that the dissolved part may become a surface defect. Therefore, in employing the CARE method as a processing method of a mask blank substrate, relationship between the substrate material and the processing liquid must be examined sufficiently, and the method should not be employed easily.

This invention was made to solve the above-mentioned problems. The object of this invention is to provide a mask blank substrate processing device, a mask blank substrate processing method, a mask blank substrate fabrication method, a fabrication method of a mask blank using the substrate, and a fabrication method of a transfer mask using the mask blank for the surface processing of a mask blank substrate that satisfies high-level smoothness and low-defect quality required in the semiconductor design rule, for example, after 1X nm generation (hp14 nm, hp10 nm, etc.).

Means to Solve the Problems

To solve the above-mentioned problems, this invention includes the following structures.

(Structure 1)

A mask blank substrate processing device for supplying a processing fluid to a mask blank substrate to process the mask blank substrate, comprising:

substrate support means for supporting the mask blank substrate in an operable manner;

a catalytic surface plate including a catalytic face placed facing a principal surface of the mask blank substrate supported by the substrate support means;

relative movement means for causing the catalytic face of the catalytic surface plate and the substrate to move relative to each other either in contact or in close proximity;

first processing fluid supply means for supplying a first processing fluid to the principal surface to conduct Catalyst Referred Etching; and physical cleaning means for removing foreign matters attached to the principal surface using a physical action.

(Structure 2)

A mask blank substrate processing device according to Structure 1, further comprising second processing fluid supply means for supplying at least one second processing fluid for subjecting the principal surface to physical cleaning.

(Structure 3)

A mask blank substrate processing device according to Structure 1, wherein the catalytic face has an area smaller than an area of the principal surface.

(Structure 4)

A mask blank substrate processing device according to any one of Structures 1 to 3, wherein the substrate support means supports the mask blank substrate in a horizontal manner, and also rotatably supports the mask blank substrate about a line passing through a center of the principal surface and which is vertical with respect to the principal surface.

(Structure 5)

A mask blank substrate processing device according to any one of Structures 1 to 4, wherein the substrate support means supports the principal surface of the mask blank substrate or a chamfered face formed adjacent the principal surface.

(Structure 6)

A mask blank substrate processing device according to any one of Structures 1 to 5, wherein the relative movement means is capable of moving the catalytic face of the catalytic surface plate horizontally between a center and an edge of the principal surface of the mask blank substrate supported by the substrate support means, and capable of moving the catalytic face of the catalytic surface plate vertically with respect to the principal surface.

(Structure 7)

A mask blank substrate processing device according to any one of Structures 1 to 6, wherein the physical cleaning means is at least one cleaning means selected from a group consisting of sheet-type megasonic cleaning means, two-fluid nozzle cleaning means, and brush cleaning means.

(Structure 8)

A mask blank substrate processing device according to any one of Structures 2 to 7, further comprising a chamber for receiving the mask blank substrate, the chamber has placed therein the substrate support means, the catalytic surface plate, the relative movement means, the first processing fluid supply means, the physical cleaning means, and the second processing fluid supply means, wherein the Catalyst Referred Etching and the physical cleaning on the principal surface of the mask blank substrate are conducted within the chamber.

(Structure 9)

A mask blank substrate processing device according to any one of Structures 1 to 8, wherein at least the catalytic face of the catalytic surface plate is made of at least one material selected from a group consisting of a transition metal selected from aluminum, scandium, titanium, vanadium, chromium, manganese, iron, cobalt, nickel, copper, zinc, yttrium, zirconium, niobium, molybdenum, technetium, ruthenium, rhodium, palladium, silver, hafnium, tantalum, tungsten, rhenium, osmium, iridium, platinum, and gold, and an alloy including at least one of the transition metals.

(Structure 10)

A mask blank substrate processing device according to Structure 9, wherein the first processing fluid and the second processing fluid are both pure water.

(Structure 11)

A mask blank substrate processing method including a step of supplying a processing fluid to a mask blank substrate to process the mask blank substrate, the mask blank substrate processing method including:

a Catalyst Referred Etching step, including supplying and contacting a first processing fluid to a principal surface of the substrate, and with a catalytic face of a catalytic surface plate in contact or in close proximity to the principal surface, causing the substrate and the catalytic face to move relative to each other so as to subject the principal surface to Catalyst Referred Etching; and a physical cleaning step for removing foreign matters attached to the principal surface using a physical action.

(Structure 12)

A mask blank substrate processing method according to Structure 11, wherein the physical cleaning step is conducted by supplying a second processing fluid to the principal surface.

(Structure 13)

A mask blank substrate processing method according to Structure 11 or 12, wherein the physical cleaning step is conducted after the Catalyst Referred Etching step.

(Structure 14)

A mask blank substrate processing method according to Structure 11 or 12, wherein the physical cleaning step is conducted before and after the Catalyst Referred Etching step.

(Structure 15)

A mask blank substrate processing method according to Structure 14, wherein the second processing fluid in the physical cleaning step conducted before the Catalyst Referred Etching step includes a chemical solution.
(Structure 16)
A mask blank substrate processing method according to any one of Structures 11 to 15, wherein a chemical cleaning step is conducted before the Catalyst Referred Etching step.
(Structure 17)
A mask blank substrate fabrication method for fabricating a mask blank substrate through the mask blank substrate processing method according to any one of Structures 11 to 16.
(Structure 18)
A fabrication method of a substrate with a multilayer reflective film, comprising forming a multilayer reflective film including a high refractive index layer and a low refractive index layer laminated alternately on a principal surface of a mask blank substrate obtained from the fabrication method of Structure 17 to fabricate the substrate with a multilayer reflective film.
(Structure 19)
A fabrication method of a substrate with a multilayer reflective film according to Structure 18, wherein the multilayer reflective film is formed by an ion beam sputtering using a target of a high refractive index material and a low refractive index material by allowing sputter particles of the high refractive index material and the low refractive index material to enter at an incident angle between 0 and 30 degrees, both inclusive, with respect to a normal line of the principal surface.
(Structure 20)
A fabrication method of a mask blank, wherein the mask blank is fabricated by forming a transfer pattern forming thin film on a principal surface of a mask blank substrate obtained through the processing method according to any one of Structures 11 to 16, or on the multilayer reflective film of the substrate with a multilayer reflective film according to Structure 18 or 19.
(Structure 21)
A fabrication method of a transfer mask, wherein the transfer pattern forming thin film of a mask blank obtained from the fabrication method of a mask blank according to Structure 20 is patterned to form a transfer pattern on the principal surface.

Effect of the Invention

According to the mask blank substrate processing device of this invention (Structure 1), Catalyst Referred Etching providing high-level smoothness to the principal surface can be conducted, the Catalyst Referred Etching of the principal surface including contacting a first processing fluid from first processing fluid supply means with the principal surface of a mask blank substrate supported by substrate support means, and with a catalytic face of a catalytic surface plate in contact or in close proximity, the substrate and the catalytic face are moved relative to each other by relative movement means; and a physical cleaning can be conducted, including removing foreign matters attached to the principal surface by physical cleaning means to thereby provide low-defect quality to the principal surface. Thus, a substrate with its principal surface having high-level smoothness and low-defect quality that are required as a mask blank substrate can be obtained by the substrate processing using this mask blank substrate processing device.

According to the mask blank substrate processing method (Structure 11) and the fabrication method of a mask blank substrate (Structure 17) of this invention, high-level smoothness can be provided to the principal surface of the mask blank substrate through the Catalyst Referred Etching step, and low-defect quality can be provided through the physical cleaning step. Thus, a substrate with its principal surface having high-level smoothness and low-defect quality that are required as a mask blank substrate can be obtained by the mask blank substrate processing method and the fabrication method of the mask blank substrate.

According to the fabrication method of a substrate with multilayer reflective film according to this invention (Structure 18), since the principal surface of the mask blank substrate obtained through the substrate processing method has high-level smoothness and low-defect quality, a multilayer reflective film hardly generating irregular defects caused by smoothness and surface defects of the substrate can be formed on the principal surface, thus achieving fabrication of the substrate with multilayer reflective film with fewer defects and high quality.

According to the fabrication method of a mask blank of this invention (Structure 19), since the principal surface of the mask blank substrate obtained through the substrate processing method has high-level smoothness and low-defect quality, a transfer pattern forming thin film hardly generating irregular defects caused by smoothness and surface defects can be formed on the principal surface, thus achieving fabrication of a mask blank with fewer defects and high quality.

According to the fabrication method of a transfer mask of this invention (Structure 20), since the transfer pattern forming thin film of the mask blank obtained by the fabrication method of the mask blank hardly generates irregular defects, a transfer pattern hardly generating defects such as a black defect can be formed on the principal surface of the mask blank substrate, thus achieving fabrication of the transfer mask with fewer defects and high quality.

MODES FOR CARRYING OUT THE INVENTIONS

Embodiment 1

Figure 1:
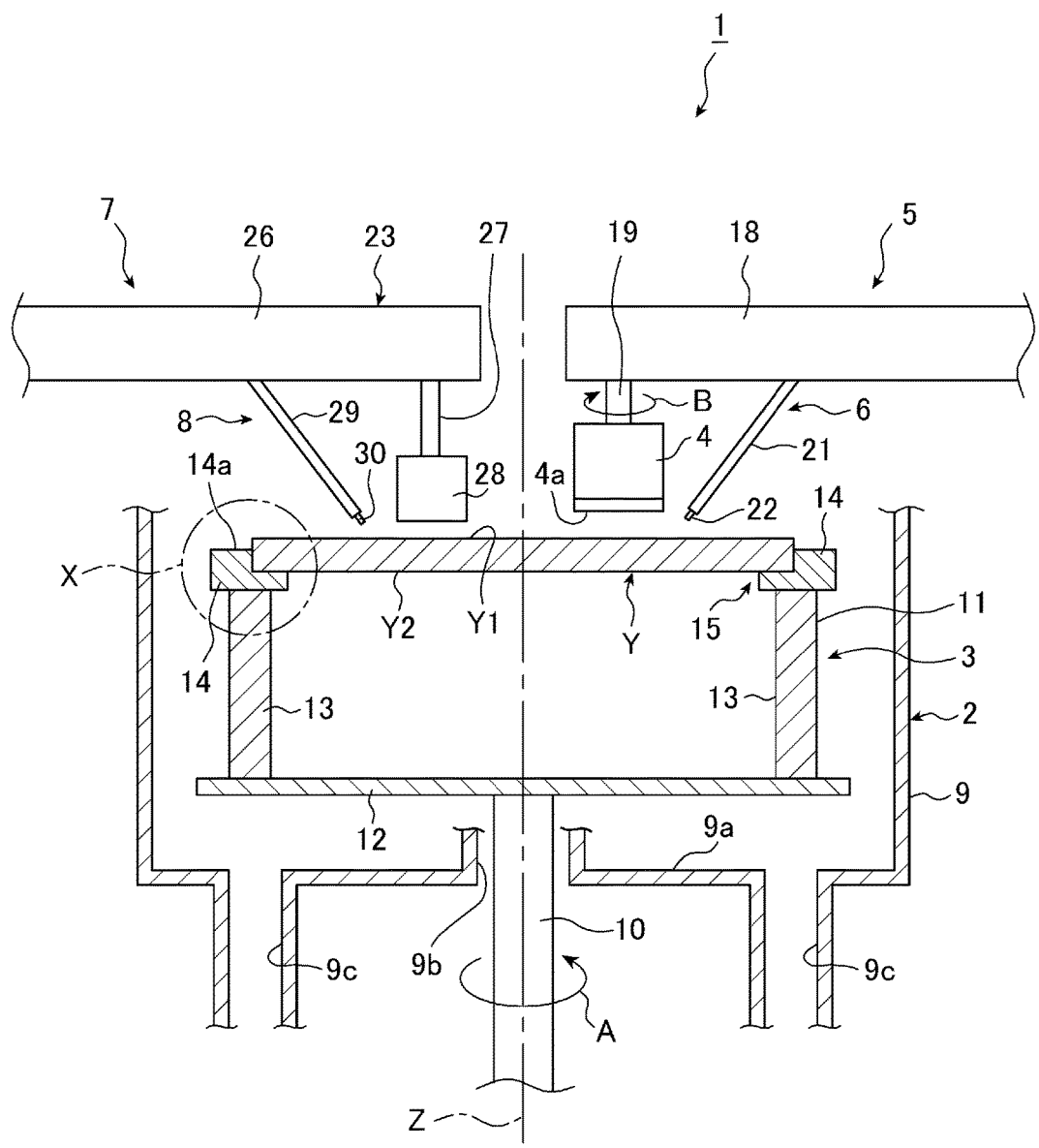
FIG. 1 is a partially sectional view showing a structure of the mask blank substrate processing device according to Embodiment 1 of this invention.
Figure 2:
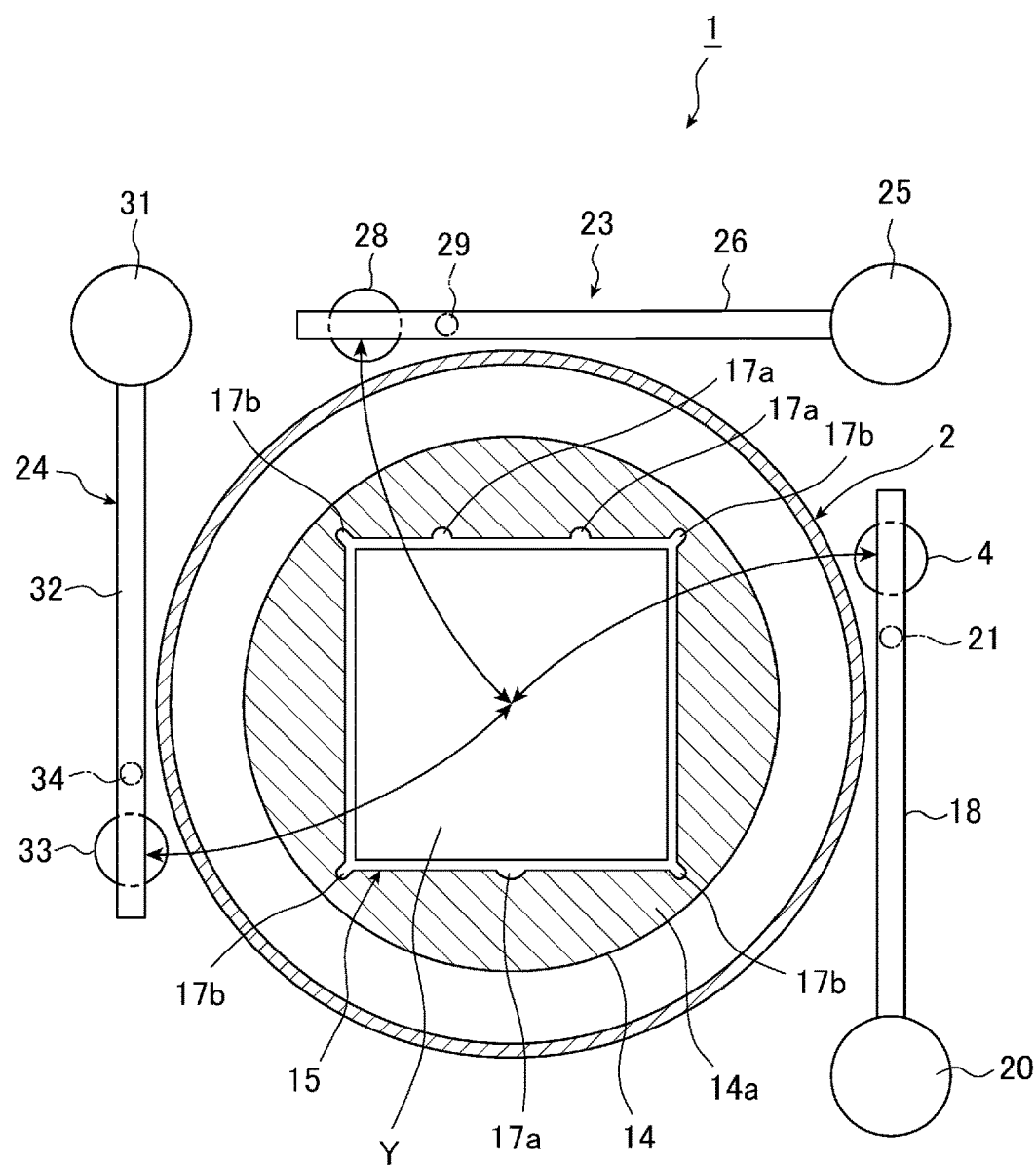
FIG. 2 is a plan view of the structure of the mask blank substrate processing device in FIG. 1 partially viewed in section.
Figure 3:
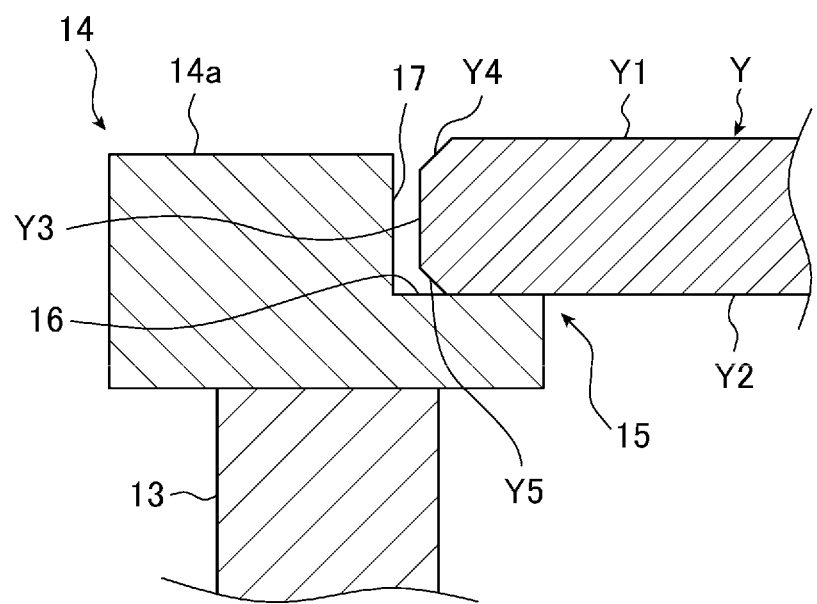
FIG. 3 is an enlarged cross sectional view of the support structure (part indicated by X) of the substrate of the substrate support means in the mask blank substrate processing device in FIG. 1

FIG. 1 is a partially sectional view showing a structure of the mask blank substrate processing device (hereafter substrate processing device) according to Embodiment 1 of this invention; FIG. 2 is a plan view of the structure of the substrate processing device in FIG. 1 partially viewed in section; and FIG. 3 is an enlarged cross sectional view of the support structure (X part) of the substrate with the substrate support means in the substrate processing device in FIG. 1.

A substrate processing device 1 according to Embodiment 1 is a sheet-type device for conducting a series of surface processing through CARE (Catalyst Referred Etching) and physical cleaning, while supplying necessary processing fluid to a single mask blank substrate (hereafter "substrate") Y.

More concretely, substrate processing device 1 includes a substantially cylindrical chamber 2 for receiving substrate Y as showing in FIG. 1 and FIG. 2, and chamber 2 contains therein substrate support means 3 for supporting substrate Y; catalytic surface plate 4 circular in plan view having a catalytic face 4a arranged to face the principal surface of substrate Y; relative movement means 5 for causing catalytic face 4a of catalytic surface plate 4 and the principal surface of substrate Y to move relative to each other in contact or in close proximity; first processing fluid supply means 6 for supplying a first processing fluid to subject the principal surface to CARE; physical cleaning means 7 for removing foreign matters attached to the principal surface using a physical action; and second processing fluid supply means 8 for supplying at least one second processing fluid for subjecting the principal surface to a physical cleaning.

<Chamber 2>

As shown in FIG. 1 and FIG. 2, chamber 2 includes a small diameter portion 9 for receiving substrate Y and substrate support means 3, and a large diameter portion (not shown) provided above small diameter portion 9 for receiving catalytic surface plate 4, relative movement means 5, first processing fluid supply means 6, physical cleaning means 7, and second processing fluid supply means 8. Provided at a central portion of a bottom 9a of small diameter portion 9 is a central hole 9b for placing a rotational axis (mentioned below) of substrate support means 3. Bottom 9a external of central hole 9b is provided with discharge channel 9c for discharging liquid and gas such as air within chamber 2 outside chamber 2. Air, gas, and liquid discharged from discharge channel 9c are separated into gas and liquid by gas/liquid separating means (not shown) provided in discharge channel 9c, and thereafter exhausted or drained outside device 1 by aspirating/exhausting means (not shown) and draining means (not shown).

As shown in FIG. 3, substrate Y received within chamber 2 includes a first principal surface Y1, a second principal surface Y2, a side face Y3, a chamfered face Y4 formed by chamfering the boundary between first principal surface Y1 and side face Y3, and a chamfered face Y5 formed by chamfering the boundary between second principal surface Y2 and side face Y3. In Embodiment 1, first principal surface Y1 is the surface on which a transfer pattern forming thin film is formed (i.e., front surface), and second principal surface Y2 is the surface without a transfer pattern forming thin film (i.e., rear surface). Material forming substrate Y is selected arbitrarily in accordance with the application of substrate Y from, e.g., glass and glass ceramic including synthetic quartz glass, soda-lime glass, borosilicate glass, aluminosilicate glass, $SiO_2$—$TiO_2$ glass, etc. For example, as substrate material used in a transmissive mask blank such as a binary mask blank and a phase shift mask blank, a material that is transmissive to exposure wavelength used should be selected. Synthetic quartz glass is preferable as a substrate material for ArF excimer laser exposure. Glass ceramic and glass such as $SiO_2$—$TiO_2$ glass having low thermal expansion property are preferable as a substrate material for use in a reflective mask blank.

<Substrate Support Means 3>

Substrate support means 3 supports rectangular substrate Y horizontally, as well as rotatably supporting substrate Y about axis Z as a central axis passing through the center of the principal surface of substrate Y and vertical with respect to the principal surface. More concretely, as shown in FIG. 1, substrate support means 3 includes a rotational axis 10 provided in central hole 9b of chamber 2 which is installed vertically from beneath, and a rotating body 11 with closed-end cylindrical shape fixed at an upper end of rotational axis 10. With vertical axis Z as a rotating center, rotational axis 10 rotates, e.g., in the direction of arrow A by means of an actuation device (not shown), and together with the rotation of rotational axis 10, rotating body 11 fixed to rotational axis 10 also rotates in an integral manner.

As shown in FIG. 1 and FIG. 2, rotating body 11 is generally formed from a bottom 12 circular in plan view, a peripheral wall 13 installed on the periphery of bottom 12, and a substrate support portion 14 provided on an upper end of peripheral wall 13 for supporting substrate Y. The rotating center (vertical axis Z) of rotating body 11 and the center of substrate Y supported by substrate support portion 14 (intersection of two diagonal lines of principal surface) are arranged coaxially, thereby preventing substrate Y from shifting horizontally within substrate support portion 14 due to the rotation of rotating body 11. Rotating body 11 is provided in chamber 2 so that a certain gap is formed between peripheral wall 13 and chamber 2. Bottom 12 is provided with a communication hole (not shown) to allow communication between rotating body 11 and chamber 2.

As shown in FIG. 2, substrate support portion 14 is in the shape of a disk in plan view, with a substrate receiving portion 15, rectangular in plan view, formed in the central portion for receiving substrate Y. As shown in FIG. 1 and FIG. 3, substrate receiving portion 15 is substantially L-shaped in cross section, including a horizontal supporting face 16 which holds in contact with four band-like peripheral regions (outer peripheral region external of the rear surface side region corresponding to the region where the transfer pattern forming thin film is to be formed on first principal surface Y1 of substrate Y) of second principal surface Y2 of horizontally-supported substrate Y and evenly supporting the four peripheral regions, and a vertical wall 17 extending vertically with respect to horizontal supporting face 16.

Preferably, the four band-like peripheral regions of substrate Y supported by horizontal supporting face 16 have the smallest possible thickness to reduce their area so as to clean the greatest range possible of substrate Y. To extend the cleaning effect not only on first principal surface Y1 of substrate Y but also on side face Y3, substrate Y is preferably placed on horizontal supporting face 16 so that side face Y3 is slightly apart from vertical wall 17. Therefore, the depth of horizontal supporting face 16 is dimensioned considering reduction of the area of the four band-like peripheral regions and distance of separation of vertical wall 17 with side face Y3 of substrate Y.

As shown in FIG. 2 and FIG. 3, height of vertical wall 17 is configured so that first principal surface Y1 of substrate Y supported by horizontal supporting face 16 is higher than upper face 14a of substrate support portion 14. This configuration is preferable since CARE and physical cleaning can be conducted sufficiently at peripheral regions of first principal surface Y1 of substrate Y. However, first principal surface Y1 may be flush with upper face 14a of substrate support portion 14, or lower than upper face 14a if necessary.

As shown in FIG. 2, vertical wall 17 of substrate receiving portion 15 is provided with a finger receiving portion 17a. Finger receiving portion 17a is a depression to ensure a space for a finger (not shown) for holding substrate Y in placing substrate Y on horizontal supporting face 16 from above chamber 2, or removing substrate Y supported by horizontal supporting face 16.

Each of four corners of vertical wall 17 of substrate receiving portion 15 is provided with recess 17b. Recess 17b is a depression to prevent four corners of substrate Y from abutting vertical wall 17 in dropping substrate Y onto horizontal supporting face 16, or removing it therefrom. Providing such recess 17b is preferable, since CARE and physical cleaning can be conducted sufficiently on the four corners of substrate Y. Further, recess 17b is configured to communicate into rotating body 11, thereby allowing the first processing fluid and the second processing fluid supplied to substrate Y through recess 17b to flow down into rotating body 11, and to be discharged from discharge channel 9c of chamber 2 through communication holes (not shown) in rotating body 11.

Substrate support means 3 as described above is provided with, e.g., optical sensing means (not shown) for optically sensing the height of upper face 14a of substrate support portion 14 of rotating body 11 and substrate height adjusting means (not shown) adjusting the height of upper face 14a to a predetermined value based on the height information sensed by the means. These means allow adjustment of the height of the principal surface of substrate Y supported by substrate support portion 14 to a position suitable for approximation or contact with catalytic face 4a of catalytic surface plate 4 in conducting CARE; and in physical cleaning, allow adjustment of the height of the principal surface to a position suitable for physical cleaning of the principal surface by physical cleaning means 7. Incidentally, an air cylinder (not shown) provided between rotational axis 10 and rotating body 11 for adjusting air pressure to move rotating body 11 vertically can be given as an example of the substrate height adjusting means without limitation, and other known means can be selected.

<Catalytic Surface Plate 4>

As shown in FIG. 1 and FIG. 2, the bottom of catalytic surface plate 4 is provided with catalytic face 4a. The area of catalytic face 4a is formed smaller than the area of the principal surface of substrate Y. This makes it possible to reduce the size of catalytic surface plate 4 for a simplified device structure. Further, since bending and collapsing that may occur in larger catalytic face can be inhibited by reducing the size of catalytic surface plate 4, CARE throughout the entire principal surface of substrate Y can reliably be conducted. In addition, since the area of catalytic face 4a is formed smaller than the area of the principal surface of substrate Y, silicon oxide that generates due to CARE processing can be effectively eliminated from the principal surface of substrate Y with processing fluid, achieving better defect quality after CARE processing.

Materials constituting at least catalytic face 4a of catalytic surface plate 4 can include at least one material selected from the group of consisting of, e.g., aluminium, scandium, titanium, vanadium, chromium, manganese, iron, cobalt, nickel, copper, zinc, yttrium, zirconium, niobium, molybdenum, technetium, ruthenium, rhodium, palladium, silver, hafnium, tantalum, tungsten, rhenium, osmium, iridium, platinum, gold, transition metal (iron, molybdenum, etc.), alloy including at least one of the above metals (SUS (stainless steel), etc.), and ceramic based solid catalyst. The materials constituting such catalytic face 4a are preferably selected arbitrarily in combination with a material constituting substrate Y or the first processing fluid mentioned below.

<Relative Movement Means 5>

Relative movement means 5 in Embodiment 1 generally includes horizontal moving means for horizontally moving catalytic face 4a of catalytic surface plate 4 between the center of the principal surface of substrate Y supported by substrate support means 3 and peripheral region thereof; vertical moving means for moving catalytic face 4a of catalytic surface plate 4 vertically with respect to the principal surface; and control means (not shown), e.g., a calculation device, for controlling the horizontal moving means and the vertical moving means to interlock with each other.

One horizontal moving means among relative movement means 5 includes arm 18 supporting catalytic surface plate 4, rotational axis 19 rotating catalytic surface plate 4, and a driving device (not shown) rotating and driving rotational axis 19. Other horizontal moving means includes arm 18, pivot axis 20 that pivots arm 18, and a driving device (not shown) rotating and driving pivot axis 20. A proximal end of arm 18 is supported horizontally by pivot axis 20 pivoted by a driving device (not shown), which is configured to pivot about pivot axis 20 between a standby position shown in FIG. 2 and a position of which catalytic face 4a of catalytic surface plate 4 supported by arm 18 reaches the center of substrate Y. This pivot allows catalytic face 4a to move horizontally throughout the principal surface of substrate Y rotated by substrate support means 3. The pivoting of arm 18 can be conducted at a constant rate throughout the pivot range, or in stages for each constant pivot angle as necessary. The driving device (not shown) for pivoting pivot axis 20 and the driving device (not shown) rotating rotational axis 19 may be separate or the same.

One vertical moving means among relative movement means 5 includes substrate height adjusting means (not shown) provided for substrate support means 3. Further, other vertical moving means among relative movement means 5 includes pressure adjusting means (not shown) and catalytic face height adjusting means (not shown) provided for catalytic surface plate 4. Catalytic surface plate 4 is provided with, e.g., optical sensing means (not shown) for optically sensing the height of catalytic face 4a in approaching the principal surface due to the pivoting of arm 18 with a premise that a first processing fluid exists between the principal surface and catalytic face 4a in conducting CARE; catalytic face height adjusting means (not shown) adjusting to a predetermined value based on the height information sensed by the means; processing pressure sensing means (not shown) for sensing processing pressure applied to the principal surface by catalytic face 4a as necessary in contacting the principal surface of substrate Y; and pressure adjusting means (not shown) for adjusting to a predetermined value based on the processing pressure information sensed by the means. These means allow adjustment of processing pressure or distance between the principal surface and catalytic face 4a suitable for CARE. An air cylinder (not shown) provided between pivot axis 20 supporting arm 18 and the driving device (not shown) for adjusting air pressure to move pivot axis 20 vertically can be given as an example of catalytic face height adjusting means (not shown), without limitation thereto, and other known means can be selected. In cases where the pressure adjusting means (not shown) adjusts the height of catalytic face 4a and adjusts the processing pressure, the pressure adjusting means (not shown) can be omitted to adjust the processing pressure using catalytic face height adjusting means (not shown).

<First Processing Fluid Supply Means 6>

First processing fluid supply means 6 includes supply tube 21 extending obliquely downward from a bottom face of arm 18 toward catalytic surface plate 4, and injection nozzle 22 provided at a tip of a bottom end of supply tube 21 for injecting the first processing fluid toward catalytic face 4a of catalytic surface plate 4.

Supply tube 21 passes through, e.g., inside of arm 18, and is connected to a first processing fluid reservoir tank (not shown) and a compression pump (not shown).

When substrate Y is formed from a glass material, the first processing fluid supplied from injection nozzle 22 can include at least one liquid selected from a group consisting of, for example, pure water, functional water such as ozone water and hydrogen water, low concentration alkaline aqueous solution, and low concentration acidic aqueous solution.

In conducting CARE, materials constructing substrate Y, for example, can include $SiO_2$—$TiO_2$ glass or synthetic quartz glass suitable for a mask blank substrate that can cope with shortening of wavelength of exposure light; materials constructing catalytic face 4a can include platinum having good corrosion resistance; and as the first processing fluid, pure water advantageous in regard to cost can be used. This case is advantageous in processing property such that microscopic projections on the principal surface of substrate Y can be selectively removed to reliably reduce surface roughness of the principal surface as stated below.

<Physical Cleaning Means 7>

Physical cleaning means 7 in Embodiment 1 includes sheet-type brush cleaning means 23 and megasonic cleaning means 24.

<Brush Cleaning Means 23>

As shown in FIG. 1 and FIG. 2, brush cleaning means 23 generally includes pivot axis 25 that pivots by means of driving device (not shown), arm 26 in a rectangular cross section pivotally supported by pivot axis 25, support axis 27 suspending from a bottom surface of the tip end side of arm 26, and brush 28 supported by support axis 27.

A proximal end of arm 26 is supported horizontally by pivot axis 25 pivoted by a driving device (not shown), configured to pivot about pivot axis 25 between a standby position shown in FIG. 2 and a position of which brush 28 supported by arm 26 reaches the center of substrate Y. This pivoting allows brush 28 to move horizontally throughout the principal surface of substrate Y. The pivoting of arm 26 can be conducted at a constant rate throughout the pivot range, or in stages for each constant pivot angle as necessary. Brush 28 can preferably include, e.g., PVA (polyvinyl alcohol) brush, without limitation, and a brush constructed of other materials can be used as long as the surface roughness of the principal surface of substrate Y is not reduced.

<Second Processing Fluid Supply Means 8 for Brush Cleaning Means 23>

Second processing fluid supply means 8 used in brush cleaning means 23 includes supply tube 29 extending obliquely downward from a bottom face of arm 26 toward brush 28, and injection nozzle 30 provided at a tip of a bottom end of supply tube 29 for injecting the second processing fluid for brush cleaning toward a location between brush 28 and the principal surface of substrate Y. Supply tube 29 passes through, e.g., inside of arm 26, and is connected to a reservoir tank (not shown) of the second processing fluid for brush cleaning and a compression pump (not shown). Thus, by providing second processing fluid supply means 8, the principal surface of substrate Y is scrubbed by brush 28 with the second processing fluid therebetween to scrape off the foreign matters attached to the principal surface to thereby conduct physical cleaning.

The second processing fluid for brush cleaning can include at least one liquid selected from a group consisting of, for example, pure water, functional water such as ozone water and hydrogen water, and neutral detergent (including surfactant and chelating agent).

<Megasonic Cleaning Means 24>

As shown in FIG. 2, megasonic cleaning means 24 generally includes pivot axis 31 that pivots by means of a driving device (not shown), arm 32 in a rectangular cross section pivotally supported by pivot axis 31, megasonic nozzle 33 supported by the lower surface of the distal side of arm 32, and an oscillator (not shown) driving megasonic nozzle 33.

A proximal end of arm 32 is supported horizontally by pivot axis 31 pivoted by a driving device (not shown), configured to pivot about pivot axis 31 between a standby position shown in FIG. 2 and a position of which megasonic nozzle 33 supported by arm 32 reaches the center of substrate Y. This pivoting allows megasonic nozzle 33 to move horizontally throughout the principal surface of substrate Y. The pivoting of arm 32 can be conducted at a constant angular rate throughout the pivot range or in stages that stops for each constant pivot angle based on the stop position as necessary. The oscillation frequency of ultrasonic wave outputted from megasonic nozzle 33 is preferably between, e.g., 1 MHz and 3 MHz.

<Second Processing Fluid Supply Means 8 for Megasonic Cleaning Means 24>

Second processing fluid supply means 8 used for megasonic cleaning means 24 includes supply tube 34 extending obliquely downward from a bottom face of arm 32 toward a tip end of megasonic nozzle 33, and an injection nozzle (not shown) provided at a tip of a bottom end of supply tube 34 for injecting the second processing fluid for megasonic cleaning toward a location between megasonic nozzle 33 and the principal surface of substrate Y. Supply tube 34 passes through, e.g., inside of arm 34, and is connected to a reservoir tank (not shown) for a second processing fluid for megasonic cleaning and a compression pump (not shown). Thus, by providing second processing fluid supply means 8, ultrasonic oscillation is conducted to the principal surface of substrate Y by megasonic nozzle 33 with the second processing fluid therebetween so that foreign matters attached to the principal surface can fall off and are removed therefrom to thereby conduct physical cleaning.

The second processing fluid for the megasonic cleaning can include, for example, hydrogen water without limitation, and other aqueous fluid can be used.

Second processing fluid supply means 8 of Embodiment 1 is configured to supply two types of second processing fluid including the processing fluid for brush cleaning and the processing fluid for megasonic cleaning. However, a single type of second processing fluid that can be used for both cleanings can be used, e.g., water such as pure water. This allows one second processing fluid supply means 8 to be used for brush cleaning and megasonic cleaning, achieving reduction of installation cost and procurement cost for the second processing fluid.

In Embodiment 1, sheet-type brush cleaning means 23 and megasonic cleaning means 24 were combined as physical cleaning means. However, the above is not for limitation, but each of brush cleaning means 23 and megasonic cleaning means 24 can be used alone, or sheet-type two-fluid cleaning means (not shown) can be used alone or in arbitrary combination with other cleaning means (e.g., brush cleaning means, megasonic cleaning means, etc.). Since using these physical cleaning means alone or in combination can reliably remove foreign matters attached to the principal surface of substrate Y, substrate Y can be provided with high low-defect quality. Further, sheet-type physical cleaning means achieving individual cleaning of substrate Y is particularly preferable for cleaning means of a mask blank substrate that requires high-level smoothness and low-defect quality.

The fluid to be used in two-fluid nozzle cleaning means can include, e.g., a combination of nitrogen ($N_2$) gas and carbonated water, without limitation.

Both the first processing fluid and the second processing fluid can be pure water. Due to such a structure, separate processing fluid supplying means are unnecessary unlike the case of using different processing fluids, and time for switching to another processing fluid can be omitted unlike the case of using different processing fluids in conducting physical cleaning after CARE, so that the entire processing time required for CARE and physical cleaning can be shortened. Further, by using water as both processing fluids, easier handling of the processing fluid in view of high safety can be achieved compared to acidic liquid, etc. used in a substrate processing method in the conventional CARE method.

Next, a substrate processing method using substrate processing device 1 is explained.

<Polishing Step>

First, principal surfaces Y1 and Y2 of substrate Y are subjected to a plurality of polishing steps beforehand including rough polishing step, precision polishing step, and superprecision polishing step prior to delivery to substrate processing device 1. The polishing steps are carried out for enhancing flatness and smoothness of principal surfaces Y1 and Y2 of substrate Y, which differ from CARE step conducted after delivery into chamber 2. After the polishing steps, a cleaning step is conducted to remove from substrate Y the polishing agent such as polishing slurry containing, e.g., colloidal silica used in the superprecision polishing step. This cleaning step differs from the cleaning step described below conducted as necessary as a pretreatment of CARE step. In the cleaning step after the polishing step, acidic aqueous solution or alkaline aqueous solution other than pure water can be used to effectively remove polishing grain from principal surfaces Y1, Y2 of substrate Y.

This polishing step is for polishing principal surfaces Y1, Y2 of substrate Y using polishing slurry containing polishing grain (polishing agent). Polishing grain used in the polishing step includes cerium oxide, zirconium oxide, silica, and colloidal silica.

In conducting the polishing step of plurality of stages, surface roughness of principal surfaces Y1 and Y2 of substrate Y can be reduced by reducing the size of the polishing grain to be used as the polishing step proceeds.

In the polishing step of a plurality of stages, colloidal silica is preferably used as a polishing grain to be used in the polishing step of the final stage. In the combination with CARE step conducted after the polishing step, it is preferable to minimize concave defects such as a pit on the principal surface of substrate Y to be introduced to CARE step, particularly principal surface Y1 to which a transfer pattern is formed. This is because, in CARE step, since principal surface Y1 of substrate Y is processed with catalytic face 4a of catalytic surface plate 4 as the standard surface, the projections existing on principal surfaces Y1 and Y2 of substrate Y are preferentially processed so that concave defects such as pits are likely to remain, or to eliminate concave defects, machining allowance in CARE step should be enlarged. Enlarging machining allowance in CARE step is unfavorable for causing longer processing time of CARE step thus leading to higher production cost. For the purpose of minimizing concave defects such as a pit, chemically modified colloidal silica is preferably used as the polishing grain. The polishing liquid containing colloidal silica preferably includes an additive and alkali compound in addition to water. In addition to coating the polishing grain surface, an additive can inhibit attacking of the polishing grain on the polishing surface for protecting the polishing surface, so that concave defects such as a pit can be inhibited. Preferably, the additive is at least a type selected from hydroxyethyl cellulose, hydroxypropyl cellulose, polyvinyl alcohol, polyvinylpyrrolidone, and prolan. Two or more of the above can be used in combination. Considering cleaning property, hydroxyethyl cellulose is preferable among these additives. The alkali compounds include ammonia, tetramethyl ammonium hydroxide, tetraethyl ammonium hydroxide, and tetrabutyl ammonium hydroxide, among which ammonia is preferable. Particle size of the polishing grain is determined arbitrarily in accordance with surface roughness required.

Separate from the above polishing step, a surface processing to control flatness of principal surfaces Y1 and Y2 of substrate Y can be conducted before the CARE step. Known methods can be used as the processing method for controlling flatness. For example, Magneto Rheological Finishing (MRF), local chemical mechanical polishing (local CMP), Gas Cluster Ion Beam etching (GCIB), Dry Chemical Planarization using local plasma etching (local DCP) can be arbitrarily selected.

MRF is a local processing method for locally polishing substrate Y by rapidly contacting polishing grain contained in a magnetic fluid on substrate Y and controlling the residence time of the contact portion.

Local CMP is a local processing method mainly polishing convex portions on principal surface Y1 of substrate Y using a small-diameter polishing pad and a polishing liquid containing polishing grain such as colloidal silica and controlling the residence time of the contact portion of the small-diameter polishing pad and substrate Y.

GCIB is a local processing method in which a reactive substance (source gas) in the form of gas at normal temperature and pressure is adiabatically expanded and ejected in a vacuum device to form gas cluster, the gas cluster is ionized by subjecting to electronic irradiation, the gas cluster ion formed thereby is accelerated in high electrical field into a gas cluster ion beam, and irradiating the beam onto substrate Y for etching process.

Local DCP is a local processing method in which local plasma etching is conducted and the plasma etching amount is controlled in accordance with a degree of convex, to thereby locally conduct dry etching.

As stated above, according to the present embodiment, flatness of principal surface Y1 of substrate Y can be controlled, or smoothness can be improved while maintaining possible flatness by surface processing before CARE step. As a result, CARE step can be conducted on principal surface Y1 of substrate Y having excellent flatness and/or smoothness. Thus, affected portion on or inside principal surface Y1 can be efficiently removed, and a low defect, high quality mask blank can be fabricated in which occurrence of peeling of a transfer pattern forming thin film formed in subsequent film forming step is inhibited.

In the case of conducting the surface processing described above after the polishing step, a polishing step corresponding to the above superprecision polishing step can be conducted for the purpose of reducing surface roughness of principal surfaces Y1, Y2 of substrate Y. On the standpoint of minimizing concave defects such as a pit, it is preferable to use chemically modified colloidal silica as polishing grain to be used, or a polishing liquid containing colloidal silica including alkali compound and an additive.

<Cleaning Step Before CARE Step>

Next, after placing substrate Y on horizontal supporting face 16 in substrate receiving portion 15 of substrate support means 3 in substrate processing device 1 for supporting substrate Y, a cleaning step is conducted as a pretreatment step of the CARE step. This cleaning step is to remove foreign matters newly attached to the principal surface of substrate Y after the cleaning step subsequent to the above polishing step. This cleaning step can eliminate a possibility of the foreign matters being bitten between substrate Y and catalytic face 4a during CARE step causing a deep defect in the principal surface of substrate Y.

In this embodiment, as a cleaning step of the pretreatment step of CARE step, a brush cleaning is conducted using brush 28 formed of PVA stated above, followed by a megasonic cleaning using megasonic nozzle 33. Incidentally, the procedure or method for physical cleaning is not limited to the above, but for example, the procedures given above can be reversed, or the two cleaning steps can be conducted simultaneously. As a procedure of the brush cleaning, arm 26 is pivoted from the standby position about pivot axis 25 of brush cleaning means 23 so that brush 28 provided on arm 26 is positioned at the periphery of substrate Y. In this condition, fluid is injected through supply tube 29 from injection nozzle 30, during which brush 28 is contacted to substrate Y and moved to the central portion of substrate Y while cleaning substrate Y. During the above, rotational axis 10 of substrate support means 3 is rotated to rotate substrate Y, so that brush 28 contacts throughout principal surface Y1 of substrate Y. Subsequently, brush 28 is moved to return to the periphery of substrate Y. After repeating such an operation for a predetermined number of times (e.g., five times), the injection of fluid from injection nozzle 30 is stopped, arm 26 is pivoted to the standby position, and brush 28 is moved to the stop position before cleaning.

As the following procedure of the megasonic cleaning, arm 32 is pivoted from the standby position about pivot axis 31 of megasonic cleaning means 24 so that megasonic nozzle 33 is positioned at the periphery of substrate Y. In this condition, fluid is injected through supply tube 34 provided on arm 32 from the injection nozzle (not shown) to principal surface Y1 of substrate Y, during which megasonic nozzle 33 is brought close to substrate Y and the fluid injected to principal surface Y1 is oscillated, while moving megasonic nozzle 33 to the central portion of substrate Y. During the above, rotational axis 10 of substrate support means 3 is rotated to rotate substrate Y, thereby oscillation by megasonic nozzle 33 is affected throughout principal surface Y1 of substrate Y. Subsequently, megasonic nozzle 33 is moved to return to the periphery of substrate Y. After repeating such an operation for a predetermined number of times (e.g., five times), the injection of fluid from the injection nozzle (not shown) is stopped, arm 32 is pivoted to the standby position, and megasonic nozzle 33 is moved to the stop position before cleaning.

A chemical effect to the extent not to substantially roughen the principal surface of substrate Y can be added to such a physical cleaning. For example, in the physical cleaning step, a chemical solution can be included in the second processing fluid supplied to the principal surface of substrate Y. Thus, in the case where foreign matters are attached on the principal surface of substrate Y before CARE step, chemical action in addition to physical action can be used to remove such foreign matters, so that the foreign matters can be reliably removed. Known chemical solutions can be used, for example, SPM (sulfuric acid peroxide mixture), APM (ammonium hydrogen-peroxide mixture), and HF (hydrofluoric acid), or functional water such as ozone water and hydrogen water, and detergent containing surfactant.

Instead of the physical cleaning described above, a chemical cleaning can be conducted to the extent not to substantially roughen the principal surface of substrate Y, which allows removal of foreign matters attached to the principal surface of substrate Y before CARE step using chemical action, such as by dissolving the foreign matters. The chemical cleaning includes, for example, RCA cleaning combining SPM (sulfuric acid peroxide mixture), APM (ammonium hydrogen-peroxide mixture), HF (hydrofluoric acid), etc., or cleaning method using functional water such as ozone water and hydrogen water, and detergent containing surfactant.

<CARE Step>

As shown in FIG. 1, etc., CARE step is conducted by supplying a first processing fluid to the principal surface of substrate Y by first processing fluid supply means 6 for contact with the principal surface, and with catalytic face 4a of catalytic surface plate 4 in contact with or in close proximity to the principal surface, substrate Y and catalytic face 4a are moved relative to each other by relative movement means 5, so as to conduct CARE on the principal surface.

As for the procedure of CARE step, arm 18 is pivoted about pivot axis 20 with catalytic surface plate 4 positioned above, so that catalytic surface plate 4 is positioned at the periphery of substrate Y. In this condition, pivot axis 20 is moved below by the air cylinder (not shown) to bring catalytic surface plate 4 into contact with or close proximity to substrate Y. In this condition, fluid is injected from injection nozzle 22 through supply tube 21 of first processing fluid supply means 6, and while rotating catalytic surface plate 4 about rotational axis 19, catalytic surface plate 4 is moved to the center of substrate Y, during which substrate Y is rotated by the rotation of rotational axis 10 of substrate support means 3.

Rotating direction of catalytic surface plate 4 (e.g., direction of arrow B) is set to be opposite from the rotation direction of substrate Y by substrate support means 3 (e.g., direction of arrow A). This is for enhancing efficiency of CARE by reversely rotating to assure peripheral speed difference therebetween. Their numbers of revolutions are set to slightly differ, achieving relative movement in which catalytic face 4a of catalytic surface plate 4 draws a different trajectory on the principal surface of substrate Y for enhanced CARE efficiency. The numbers of revolutions of substrate Y and catalytic face 4a are respectively set within the range of between, e.g., 5 rpm and 200 rpm. Further, processing time is set within the range between, e.g., 5 and 120 minutes. Moreover, processing pressure applied as necessary is arbitrarily adjusted in the range between, e.g., 0 hPa and 1000 hPa, and preferably 10 hPa to 1000 hPa.

Next, with catalytic surface plate 4 in contact with or in close proximity to substrate Y, arm 18 is moved so that catalytic surface plate 4 is moved from central portion of substrate Y to the periphery. After repeating such an operation for a predetermined number of times (e.g., five times), injection of fluid from injection nozzle 22 is stopped, catalytic surface plate 4 is moved upward by the air cylinder to move the catalytic surface plate away from substrate Y, and arm 18 is moved about pivot axis 20 to move catalytic surface plate 4 to the stop position before CARE step.

This CARE step reliably decreases surface roughness of the principal surface so that high-level smoothness can be applied to the principal surface. For example, in the case of using synthetic quartz glass as a substrate material, platinum as a catalyst material, and pure water as a first processing fluid, hydroxyl group in pure water on catalytic face 4a generates as active species on catalytic face 4a, and hydrolysis reaction may proceed in which the active species selectively binds to silicon of micro projections on the principal surface in contact or in close proximity to catalytic face 4a to create lysate in pure water (silicon oxide), thus the micro projections can be selectively removed.

<Cleaning Step after CARE Step>

This cleaning step is conducted for the purpose of removing foreign matters attached to the principal surface during or after CARE step while maintaining high-level smoothness provided by CARE step on the principal surface. Therefore, physical cleaning step is preferably used for this cleaning step. This is because the physical cleaning step can efficiently provide physical action on the foreign matters to remove the foreign matters from the principal surface while maintaining high-level smoothness of the principal surface. Particularly, in CARE step where the substrate material is glass and pure water is used as the processing fluid, it is most effective when lysate (silicon oxide) present in pure water is attached to principal surface Y1 or Y2 of substrate Y. When chemical cleaning is conducted as a cleaning method after CARE step, silicon oxide on principal surfaces Y1 and Y2 of substrate Y forms a mask causing erosion of the glass substrate, resulting in an increase of surface roughness or generation of projections at portions with silicon oxide attached thereto, thus being unfavorable.

As a cleaning step after CARE step, brush cleaning by brush 28 formed from PVA stated above is initially conducted, and then megasonic cleaning using megasonic nozzle 33 is conducted. The procedure or method for the physical cleaning is not limited to the above, but the procedures given above can be reversed, or the two cleaning steps can be conducted simultaneously. The brush cleaning and megasonic cleaning steps can be carried out with the procedures similar to the procedure before the CARE step stated above.

By using a part of aspirating force of aspirating/exhausting means (not shown), the first processing fluid and second processing fluid supplied to substrate Y through four recesses 17b provided on vertical wall 17 of substrate support portion 14 can be flown down into rotating body 11, and can be efficiently discharged via communication hole (not shown) of rotating body 11 and out of discharge channel 9c of chamber 2.

Thus, according to Embodiment 1, since means described above for carrying out CARE and physical cleaning are arranged within single chamber 2 of substrate processing device 1, CARE and physical cleaning can be conducted continuously on the principal surface of substrate Y. Thus, in conducting physical cleaning after CARE, high-level smoothness can be provided by CARE on the principal surface of substrate Y, a well as providing high quality with fewer defects by physical cleaning while maintaining the high-level smoothness. Therefore, substrate processing device 1 as described above and the substrate processing method using substrate processing device 1 are suitable for surface processing of, e.g., a mask blank substrate for EUV exposure and ArF excimer laser exposure mask blank substrate used after 1X generation (hp14 nm, hp10 nm, etc.) in semiconductor design rule.

Furthermore, a mask blank fabricated by forming a transfer pattern forming thin film on a mask blank substrate of high-level smoothness and low-defect quality, and a transfer mask fabricated by forming a transfer pattern on the principal surface by patterning a transfer pattern forming thin film of the mask blank both hardly generate a defect caused by low smoothness and surface defect of the substrate, which exhibits a high-level quality required after 1X nm generation (hp14 nm, hp10 nm, etc.), for example.

In this embodiment, the principal surface of mask blank substrate Y obtained through the mask blank substrate processing method can be subjected to defect inspection step for inspecting defects such as convex defect and concave defect, as necessary. This defect inspection step can be conducted using a known defect inspection device (e.g., Teron610: manufactured by KLA-Tencor Corp.) under a predetermined defect inspection condition. As for the defect inspection condition, detection sensitivity sufficient to confirm the smoothness and low-defect quality at a level required on the principal surface (detection sensitivity detecting a defect of, e.g., 21.5 nm at SEVD conversion) can be employed. By conducting the defect inspection step, confirmation can be made whether the principal surface of substrate Y satisfies high-level smoothness and low-defect quality required for, e.g., after 1X nm generation (hp14 nm, hp10 nm, etc.).

Embodiment 2

Figure 4:
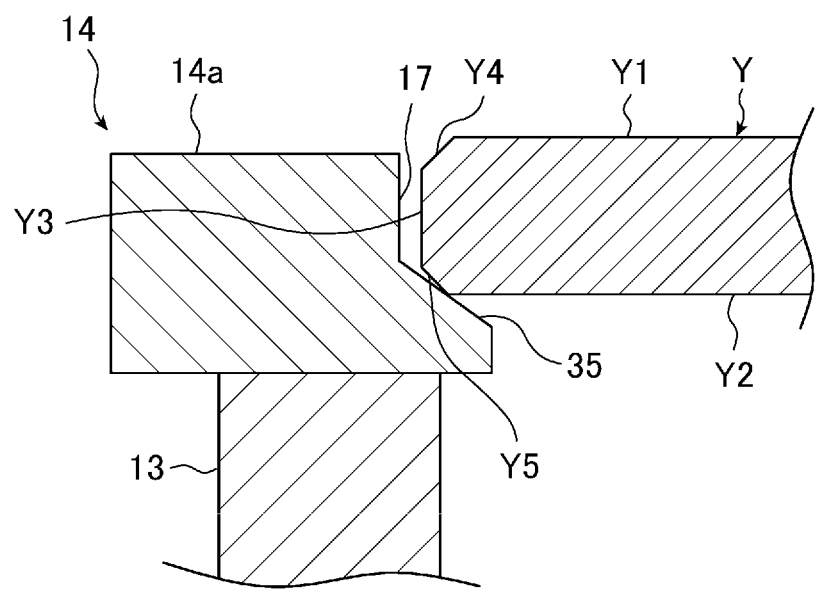
FIG. 4 is an enlarged cross sectional view of the support structure of the substrate with the substrate support means in the mask blank substrate processing device of Embodiment 2 of this invention.

FIG. 4 is an enlarged cross-sectional view of the support structure of the substrate of a substrate support means in the mask blank substrate processing device according to Embodiment 2 of this invention, in which the same reference numerals are applied to the same components in FIG. 1 to FIG. 3 to omit overlapping explanation.

In Embodiment 2, substrate receiving portion 15 of substrate support means 3 includes tapered supporting surface 35 instead of horizontal supporting face 16 in Embodiment 1. Tapered supporting surface 35, which is for supporting the boundary between chamfered face Y5 and second principal surface Y2, is configured such that the inclination angle of tapered supporting surface 35 with respect to horizontal direction is smaller than the inclination angle of chamfered face Y5 of substrate Y supported horizontally with respect to second principal surface Y2.

According to Embodiment 2, the structure to support the boundary by tapered supporting surface 35 can minimize the contact area of substrate support means 3 with substrate Y, so that not only first principal surface Y1, side face Y3, and chamfered face Y4 of substrate Y, but also chamfered face Y5 can be cleaned by physical cleaning, etc.

The inclination angle of the tapered supporting surface can be similar to the inclination angle of chamfered face Y5, so that the tapered supporting surface can support the entire face of chamfered face Y5. Such a structure can reliably support substrate Y.

The principal surface of mask blank substrate Y obtained using the mask blank substrate processing device in this embodiment can be subjected to defect inspection step for inspecting defects such as convex defect and concave defect similar to Embodiment 1, as necessary. By conducting defect inspection step, confirmation can be made whether the principal surface of substrate Y satisfies high-level smoothness and low-defect quality required, e.g., after 1X nm generation (hp14 nm, hp10 nm, etc.).

Embodiment 3

The mask blank substrate processing method and the mask blank substrate fabrication method according to Embodiment 3 of this invention is to fabricate a mask blank substrate by conducting <CARE Step> and <Cleaning Step after CARE Step> as explained above. Further, in the mask blank substrate processing method and the mask blank substrate fabrication method according to Embodiment 3, <Polishing Step> and <Cleaning Step before CARE Step> can be conducted as necessary.

Moreover, in this embodiment, the principal surface of mask blank substrate Y processed by the mask blank substrate processing method, or the principal surface of mask blank substrate Y fabricated through the mask blank substrate fabrication method can be subjected to defect inspection step for inspecting defects such as convex defect and concave defect similar to Embodiment 1, if necessary. By conducting the defect inspection step, confirmation can be made whether the principal surface of substrate Y satisfies high-level smoothness and low-defect quality required for, e.g., after 1X nm generation (hp14 nm, hp10 nm, etc.).

Embodiment 4

The fabrication method of a substrate with a multilayer reflective film according to Embodiment 4 of this invention includes forming a multilayer reflective film formed by laminating a high refractive index layer and a low refractive index layer alternately on a principal surface subjected to CARE and physical cleaning of substrate Y fabricated by the method explained in the mask blank substrate processing method or the mask blank substrate fabrication method of Embodiment 3 to fabricate a substrate with a multilayer reflective film, or forming a protective film on the multilayer reflective film to fabricate a substrate with a multilayer reflective film.

In the fabrication method of a substrate with a multilayer reflective film according to Embodiment 4, since a substrate with a multilayer reflective film is fabricated using substrate Y obtained through the mask blank substrate processing method and the mask blank substrate fabrication method of Embodiment 3, deterioration of properties due to substrate factor can be prevented so that a substrate with a multilayer reflective film with desired properties can be fabricated.

On the multilayer reflective film described above, it is preferable to form a multilayer reflective film by ion beam sputtering using a target of a high refractive index material and a low refractive index material so that the sputter particles of the high refractive index material and the low refractive index material are entered at an incident angle between 0 degrees and 30 degrees, both inclusive, relative to the normal line of the principal surface, and rendering the sputter particles of the high refractive index material and the low refractive index material between 0 degrees and 30 degrees, both inclusive, relative to the normal line of substrate Y, thereby causing high smoothening of the surface roughness of the multilayer reflective film, so that the number of detected defects under the high sensitivity defect inspection condition can be reduced.

In this embodiment, a defect inspection step for inspecting convex defect or concave defect similar to Embodiment 1 can be conducted on the principal surface of substrate Y subjected to CARE and physical cleaning obtained through the mask blank substrate processing method of Embodiment 3, or the principal surface of substrate Y subjected to CARE and physical cleaning fabricated in the mask blank substrate fabrication method of Embodiment 3. By conducting the defect inspection step, confirmation can be made whether the principal surface of substrate Y satisfies high-level smoothness and low-defect quality required for, e.g., after 1X nm generation (hp14 nm, hp10 nm, etc.).

Embodiment 5

The mask blank fabrication method of this invention according to Embodiment 5 is for fabricating a mask blank by forming a transfer pattern forming thin film on the principal surface of substrate Y subjected to CARE and physical cleaning fabricated by the method described in the mask blank substrate processing method of Embodiment 3, or on the substrate with a multilayer reflective film (multilayer reflective film or protective film) fabricated by the method described in the fabrication method of the substrate with a multilayer reflective film according to Embodiment 4. In the case where the mask blank is a binary mask blank, a light shielding film is formed as a transfer pattern forming thin film. In the case where the mask blank is a half tone phase shift mask blank, a light-semitransmissive film is formed as a transfer pattern forming thin film, or a light-semitransmissive film and a light shielding film are formed as a transfer pattern forming thin film. Further, in the case where the mask blank is an EUV reflective mask blank, an absorber film is formed as a transfer pattern forming thin film. In the case of EUV reflective mask blank, a rear surface conductive film is normally formed on a principal surface of substrate Y without a multilayer reflective film.

According to Embodiment 5, since a mask blank is fabricated using substrate Y obtained by the mask blank substrate processing method of Embodiment 3, or the substrate with a multilayer reflective film obtained by the fabrication method of the substrate with a multilayer reflective film of Embodiment 4, deterioration of properties due to substrate factor can be prevented so that a mask blank having a desired property can be manufactured.

On the principal surface of substrate Y subjected to CARE and physical cleaning obtained through the mask blank substrate processing method of Embodiment 3 used in this embodiment, a defect inspection step for inspecting convex defect or concave defect similar to Embodiment 1 can be conducted. By conducting the defect inspection step, confirmation can be made whether the principal surface of substrate Y satisfies high-level smoothness and low-defect quality required for, e.g., after 1X nm generation (hp14 nm, hp10 nm, etc.).

Embodiment 6

The transfer mask fabrication method according to Embodiment 6 of this invention is to fabricate a transfer mask by patterning the transfer pattern forming thin film of the mask blank fabricated by the method described in the mask blank fabrication method of Embodiment 5 with a known lithography technique to form a transfer mask.

According to Embodiment 6, since a transfer mask is fabricated using a mask blank obtained by the mask blank fabrication method of Embodiment 5, deterioration of properties due to substrate factor can be prevented so that a transfer mask having a desired property can be manufactured.

EXAMPLES

Example 1

(Fabrication of a Mask Blank Glass Substrate)

Example 1 is a concrete example of the processing method of a mask blank glass substrate. Example 1 includes the following steps.

(1) First Polishing (Rough Polishing) Step

End surface of $SiO_2$—$TiO_2$ glass substrate (152 mm×152 mm) Y was chamfered and ground, ten glass substrates Y were placed in a double side polishing device, and rough polishing was conducted under the following polishing condition. Sets of glass substrates Y each including ten substrates were rough-polished for five sets, with a sum of fifty glass substrates Y. Processing load and polishing time were adjusted arbitrarily.

slurry: aqueous solution containing cerium oxide (average particle size 2 to 3 μm)
polishing pad: hard polisher (urethane pad)

After the above polishing step, glass substrate Y was immersed (ultrasonic wave application) and cleaned in a cleaning bath for removing polishing grain attached to the glass substrate.

(2) Second Polishing (Precision Polishing) Step

Ten glass substrates Y that went through the first polishing were placed in the double side polishing device, and precision polishing was conducted under the following polishing condition. Sets of substrates each including ten substrates were polished for five sets, with a sum of fifty glass substrates Y subjected to precision polishing. Processing load and polishing time were adjusted arbitrarily.

slurry: aqueous solution containing cerium oxide (average particle size 1 μm)
polishing pad: soft polisher (suede type)

After the above polishing step, glass substrate Y was immersed (ultrasonic wave application) and cleaned in a cleaning bath for removing polishing grain attached to glass substrate Y.

(3) Third Polishing (Superprecision Polishing) Step

Ten glass substrates Y that went through the second polishing were placed in the double side polishing device, and superprecision polishing was conducted under the following polishing condition. Sets each including ten glass substrates Y were subjected to superprecision polishing for five sets, with a sum of fifty glass substrates Y. Processing load and polishing time were adjusted arbitrarily.

slurry: alkaline aqueous solution containing colloidal silica (pH 10.2)
polishing pad: super-soft polisher (suede type)
slurry supply temperature: 25° C.

The slurry used in this superprecision polishing step was prepared as follows. An aqueous solution containing colloidal silica (particle size 20 to 500 nm, central diameter 200 nm) was adjusted to alkalinity, and filtered using polyethylene membrane filters. The membrane filters were used in three stages with a combination of different filter diameters. The filter diameter of the first stage was 5000 nm, the second stage 3000 nm, and the third stage (final stage) 1000 nm. The colloidal silica used was obtained by synthesizing a material of highly pure alkoxysilane through sol-gel process. After the filtration, the alkali metal content of the slurry was 0.1 ppm or less.

The above superprecision polishing was conducted using the slurry containing the colloidal silica thus prepared.

After the superprecision polishing step, glass substrate Y was immersed (ultrasonic wave application) and cleaned in a cleaning bath including a cleaning solution containing an alkaline aqueous solution of sodium hydroxide.

Next, surface configuration (surface form, flatness) of 148 mm×148 mm area on the front and rear surfaces (Y1, Y2) of glass substrate Y that went through the polishing step was measured using a flatness measuring device (UltraFlat200 manufactured by Tropel Corp.). As a result, the flatness of the front and rear surfaces (Y1, Y2) of glass substrate Y was 290 nm (convex). The measured result of the surface configuration (flatness) of the glass substrate surface was stored in a computer as information of height with respect to a reference surface for each measuring point, compared with reference value 30 nm (convex) of the front surface flatness and reference value 50 nm of rear surface flatness necessary for glass substrate Y, and the difference (required removal quantity) was calculated by a computer.

Next, processing condition for the local surface processing according to the required removal quantity was set for each processing spot shape area in the glass substrate surface. A dummy substrate was processed at a spot in advance in the same manner as in the actual processing without being moved for a given period of time, the shape of the dummy substrate was measured with the same measuring device as used to measure the surface configuration of the front and rear surfaces, and the processed volume of the spot per unit time was measured. Then, the scanning speed for raster scanning of glass substrate Y was determined according to the required removal quantity obtained from the information of the spot and the information of the surface configuration of glass substrate Y.

The surface configuration was adjusted by performing a local surface treatment by magneto rheological finishing (MRF) using a substrate finishing device with magnetic fluid according to the processing condition as set above, in such a way that the flatness of the front and rear surfaces of the glass substrate is equal to or below the reference value described above. It is noted that the magnetic viscoelastic fluid used for this treatment contains an iron component, and the polishing slurry was an alkaline aqueous solution containing about 2 wt % cerium oxide as a polishing agent. Thereafter, the glass substrate was immersed in a cleaning bath containing aqueous solution of hydrochloric acid (temperature: about 25° C.) with a concentration of about 10% for about 10 minutes, and then rinsed with pure water and dried by isopropyl alcohol (IPA).

Thereafter, double-sided touch polishing using colloidal silica grain was conducted on the principal surfaces (Y1, Y2) of glass substrate Y. After the double-sided touch polishing, glass substrate Y was immersed (ultrasonic wave application) and cleaned in a cleaning bath containing a cleaning solution containing an alkaline aqueous solution of sodium hydroxide.

Next, glass substrate Y that went through the above polishing step was subjected to the following substrate processing using the substrate processing device as depicted, namely, in the same spin chamber. The substrate processing in Example 1 consists of pretreatment step, CARE step, and posttreatment step, and the pretreatment step and the posttreatment step were conducted by physical cleaning.

(1) Pretreatment Step

As a processing before CARE (pretreatment), first, ozone water cleaning using ozone water (ozone concentration: 30 ppm) was conducted for the purpose of hydrophilizing the principal surface of glass substrate Y supported by substrate support means 3 installed in chamber 2 of substrate processing device 1. Next, brush cleaning was conducted using a polyvinyl alcohol (PVA) brush, alkali based detergent, and water for the purpose of removing foreign matters on the principal surface of the glass substrate, and rinsed with pure water for the purpose of removing the detergent.

(2) CARE Step

Immediately after completion of the pretreatment step, CARE step was conducted with the following procedure.

With a first processing fluid present between the principal surface of glass substrate Y supported by substrate support means 3 and catalytic face 4a of catalytic surface plate 4, glass substrate Y and catalytic face 4a were moved relative to each other to react the active species produced on the surface of catalytic face 4a and the principal surface of glass substrate Y, and the machining-affected layer on the principal surface was removed, to thereby conduct the surface processing.

The machining allowance in CARE step was determined as 100 nm for removing the machining-affected layer formed during the above polishing step.

Pure water was used as the first processing fluid, and catalytic face 4a (outer diameter: 35 mm) consisting of platinum was used. Glass substrate Y and catalytic surface plate 4 were rotated in opposite directions from each other, number of revolution of glass substrate Y was set at 10.3 rpm, and catalytic surface plate 4 at 10 rpm. Processing pressure applied to the principal surface of glass substrate Y during processing was set at 250 hPa.

(3) Posttreatment Step

As a treatment after CARE (posttreatment), first, brush cleaning was conducted using polyvinyl alcohol (PVA) brush 28, neutral detergent, and water, followed by megasonic cleaning using megasonic nozzle (oscillation frequency: 3 MHz) 33 and hydrogen water ($H_2$ concentration: 1.2 ppm), and thereafter two-fluid cleaning was conducted using nitrogen ($N_2$) gas and carbonated water (electric resistivity: 0.2 MΩ·cm), and finally, rinsed with pure water.

The surface roughness of principal surface Y1 of fifty glass substrates Y obtained after completion of the substrate processing was measured using an atomic force microscope (AFM), achieving a good result of 0.08 nm at Rms (root mean square surface roughness).

Further, 132 mm×132 mm area of the principal surface of glass substrate Y (transfer mask forming area) was inspected for defects using a mask blank defect inspection device (MAGICS M1350: manufactured by Lasertec Co.), achieving a good result of zero defects.

(Fabrication of a Glass Substrate with a Multilayer Reflective Film)

A multilayer reflective film in which a high refractive index layer and a low refractive index layer are laminated alternately was formed by ion beam sputtering on principal surface Y1 of mask blank substrate Y obtained through the above steps, thereafter a protective film was formed on the multilayer reflective film, and a glass substrate with a multilayer reflective film was fabricated.

The multilayer reflective film was fabricated such that a silicon (Si) film (high refractive index layer) of 4.2 nm film thickness and molybdenum (Mo) film (low refractive index layer) of 2.8 nm film thickness were formed as one pair, and forty pairs were fabricated (total film thickness: 280 nm). The protective film was formed from ruthenium (Ru) with 2.5 nm film thickness. The silicon film and molybdenum film constructing the multilayer reflective film and the ruthenium film constructing the protective film were formed so that the incident angle of silicon particles, molybdenum particles, and ruthenium particles entering the normal line of principal surface Y1 of mask blank substrate Y from the silicon target, molybdenum target, and ruthenium target is 30 degrees.

132 mm×132 mm area (transfer mask forming area) of the protective film surface of the glass substrate with a multilayer reflective film thus obtained was inspected for defects using a mask blank defect inspection device (Teron610: manufactured by KLA-Tencor Corp.), achieving a good result of 675 defects. The defect inspection was conducted under a detection sensitivity condition detecting a defect of 21.5 nm size at SEVD conversion.

(Fabrication of a Reflective Mask Blank for EUV Exposure)

Next, an absorber film including tantalum boron nitrides (TaBN) was formed on a protective film surface of a glass substrate with a multilayer reflective film by DC magnetron sputtering to fabricate a reflective mask blank. This absorber film was formed by facing a tantalum boride (TaB) target (Ta:B=80:20) with a glass substrate with a multilayer reflective film, and conducting reactive sputtering under a mixed gas atmosphere of xenon (Xe) gas and nitrogen ($N_2$) gas ($Xe:N_2$=90%:10%). The film thickness of the absorber film was 70 nm. The crystal structure of the absorber film was an amorphous structure, as measured by X-ray diffraction device (XRD).

Further, on the rear surface (second principal surface Y2) of glass substrate Y with multilayer reflective film without the multilayer reflective film, a rear surface conductive film was formed by DC magnetron sputtering. The rear surface conductive film was formed by facing a chromium (Cr) target with a rear surface of a glass substrate with a multilayer reflective film, and conducting reactive sputtering under a mixed gas atmosphere of argon (Ar) gas and nitrogen (N2) gas (Ar:N2=90%:10%), and a reflective mask blank for EUV exposure was obtained. The film thickness of the rear surface conductive film was 20 nm.

132 mm×132 mm area (transfer mask forming area) of the absorber film surface of the reflective mask blank for EUV exposure thus obtained was inspected for defects using a mask blank defect inspection device (MAGICS M1350: manufactured by Lasertec Co.), achieving a good result of eight defects.

(Fabrication of Reflective Mask)

The surface of the above mentioned absorber film was coated with a resist by spin coating, heated and cooled, and a resist film of 150 nm film thickness was formed. Next, through drawing and developing steps of a desired pattern, a resist pattern was formed. With this resist pattern as a mask, TaBN film as an absorber film was patterned through dry etching using chlorine ($Cl_2$) gas and helium (He) gas, to thereby form an absorber pattern on the protective film. Subsequently, the resist film was removed, cleaned, and a desired reflective mask was fabricated. The obtained reflective mask was excellent, without a defect transferred to the transferring object.

Reference Example

In the reference example, a mask blank glass substrate was fabricated under the same condition as Example 1, except that cleaning step as a pretreatment step of the substrate processing on the mask blank glass substrate in Example 1 was not conducted before CARE step, and the measurement of surface roughness and inspection for defects were conducted.

The result was 0.08 nm at Rms (root mean square surface roughness), and the result of defect inspection was eighteen defects. The obtained mask blank glass substrate had a surface roughness on its principal surface similar to that of Example 1, but two defects, which is slightly greater than Example 1.

Comparative Example

In the comparative example, a mask blank glass substrate was fabricated under the same condition as Example 1, except for dip cleaning using aqua regia (temperature: about 65° C.) followed by cleaning using sulfuric acid peroxide mixture (SPM) (90° C.), subsequently dip cleaning using neutral detergent (detergent containing anionic surfactant and nonionic surfactant) and water, and thereafter dip cleaning using pure water were conducted instead of the post-treatment step of substrate processing on the mask blank glass substrate in Example 1, and the measurement of surface roughness and inspection for defects were conducted.

The result was 0.10 nm at Rms (root mean square surface roughness), and the result of defect inspection was thirty two defects. The obtained mask blank glass substrate had a surface roughness on its principal surface of 0.10 nm that is greater than that of Example 1, and the number of defects was seven, which is greater than Example 1.

A multilayer reflective film in which a high refractive index layer and a low refractive index layer are laminated alternately was formed by ion beam sputtering similar to Example 1 on principal surface Y1 of mask blank substrate Y obtained through the above steps, thereafter a protective film was formed on the multilayer reflective film, and a glass substrate with a multilayer reflective film was fabricated. Furthermore, in a similar manner as Example 1, an absorber film was formed on the protective film surface of the glass substrate with a multilayer reflective film by DC magnetron sputtering, a rear surface conductive film was formed on second principal surface Y2 of glass substrate Y with a multilayer reflective film, and a reflective mask blank for EUV exposure was obtained.

In a similar manner as Example 1, the defect inspection was conducted on the glass substrate with a multilayer reflective film and the reflective mask blank for EUV exposure of the reference example and the comparative example. The number of defects on the glass substrate with a multilayer reflective film in the reference example was 748, the reflective mask blank for EUV exposure was 11, the glass substrate with a multilayer reflective film of the comparative example was 10092, and the reflective mask blank for EUV exposure was 26, resulting in detection of significantly greater numbers of defects compared to Example 1. Defect inspection for the glass substrate with a multilayer reflective film and the reflective mask blank for EUV exposure was conducted using Teron610: manufactured by KLA-Tencor Corp., and a mask blank defect inspection device (MAGICS M1350: manufactured by Lasertec Co.), respectively.

Further, a reflective mask was fabricated in a similar manner as Example 1 using the reflective mask blank for EUV exposure of the comparative example. As a result, considerable defects transferred to the transferring object were detected, and the reflective mask was not sustainable for actual use.

Example 2

In Example 2, fifty mask blank glass substrates were fabricated under the same condition as Example 1 except for substrate processing (pretreatment step, CARE step, post-treatment step) on the mask blank glass substrate in Example 1 were each conducted in separate cleaning units, the glass substrates after each processing step were transferred by substrate transfer means (not shown) between the cleaning units; and the measurement of surface roughness and inspection for defects were conducted.

Inspection showed a good result of 0.07 nm at Rms (root mean square surface roughness). The result of defect inspection using the mask blank defect inspection device (MAGICS M1350: manufactured by Lasertec Co.) was three defects.

While the number of detected defects in the defect inspection slightly increased compared to Example 1, the cause of the result is considered as the foreign matters attached during transfer of the glass substrate by the substrate transfer means between the cleaning units after each process.

A multilayer reflective film in which a high refractive index layer and a low refractive index layer are laminated alternately was formed on principal surface Y1 of mask blank substrate Y obtained through the above steps by ion beam sputtering in a similar manner as Example 1, followed by forming a protective film on the multilayer reflective film, and a glass substrate with a multilayer reflective film was fabricated. Moreover, an absorber film was formed by DC magnetron sputtering on the protective film surface of the glass substrate with a multilayer reflective film in a similar manner as Example 1, a rear surface conductive film was formed on second principal surface Y2 of glass substrate Y with a multilayer reflective film, and a reflective mask blank for EUV exposure was obtained.

In a similar manner as Example 1, the glass substrate with a multilayer reflective film and the reflective mask blank for EUV exposure of Example 2 were inspected for defects, achieving a good result of 729 defects for the glass substrate with a multilayer reflective film and 13 defects for the reflective mask blank for EUV exposure. The defect inspection of the glass substrate with a multilayer reflective film and the reflective mask blank for EUV exposure were conducted using Teron610: (manufactured by KLA-Tencor Corp.) and a mask blank defect inspection device (MAGICS M1350: manufactured by Lasertec Co.), respectively.

Furthermore, a reflective mask was fabricated in the same manner as Example 1 using the reflective mask blank for EUV exposure of Example 2. The resulting reflective mask was excellent, without a defect transferred to the transferring object.

Example 3

In Example 3, fifty mask blank glass substrates were fabricated under the same condition as Example 1, except for the polishing liquid using colloidal silica polishing grain used in the polishing step (superprecision polishing step and double-sided touch polishing step) of Example 1 was replaced by a colloidal silica polishing liquid containing hydroxyethyl cellulose as an additive and ammonia as an alkali compound, and in the cleaning step after the polishing step, immersed (ultrasonic wave application) in a cleaning bath containing a cleaning liquid including low concentration alkaline aqueous solution. The slurry used was pH 10.6.

The surface roughness of the obtained glass substrate principal surface was 0.060 nm at Rms (root mean square surface roughness), achieving a good result. The result of defect inspection using the mask blank defect inspection device (MAGICS M1350: manufactured by Lasertec Co.) was zero defects.

Further, a protective film surface of the glass substrate with a multilayer reflective film was inspected for defects using a mask blank defect inspection device (Teron610: manufactured by KLA-Tencor Corp.), achieving an excellent result of 427 defects. The defect inspection was conducted under a detection sensitivity condition detecting a defect of 21.5 nm size at SEVD conversion. This is inferred as caused by inhibition of concave defects such as minute pit defects on the glass substrate in the polishing step using loose abrasive, and reliable removal of foreign matters attached to the glass substrate principal surface in CARE step by physical cleaning so that convex/concave defects did not increase by formation of the multilayer reflective film and the protective film on the glass substrate principal surface.

Example 4

In Example 4, a mask blank glass substrate was fabricated under the same condition as Example 3, except for, instead of the posttreatment after CARE step in Example 3, dip cleaning using aqua regia (temperature: about 65° C.) followed by cleaning using sulfuric acid peroxide mixture (SPM) (90° C.), subsequently dip cleaning using neutral detergent (detergent containing anionic surfactant and non-ionic surfactant) and water, followed by dip cleaning using pure water were conducted.

The surface roughness of the resulting glass substrate principal surface was 0.08 nm at Rms (root mean square surface roughness), and the result of defect inspection was two defects.

Further, defect inspection of the protective film surface of the glass substrate with a multilayer reflective film was conducted using a mask blank defect inspection device (Teron610: manufactured by KLA-Tencor Corp.), achieving a good result of 589 defects. The defect inspection was conducted under a detection sensitivity condition detecting a defect of 21.5 nm size at SEVD conversion. This is inferred as caused by inhibition of concave defects such as minute pit defects on the glass substrate in the polishing step using loose abrasive, so that concave defects did not increase by formation of the multilayer reflective film and the protective film on the glass substrate principal surface.

Thus, as stated above in Examples 3 and 4, by using a colloidal silica polishing liquid containing an additive and an alkali compound as a polishing liquid used in the polishing step, attack on the mask blank glass substrate can be inhibited, thus inhibiting concave defects such as minute pit defect. Since the above mentioned colloidal silica polishing liquid has pH positioned in an alkaline region and has a high negative potential as a zeta potential, minute convex defects caused by remaining colloidal silica grain can be inhibited by using, as a cleaning liquid to be used after the polishing step, an alkaline aqueous solution such as low concentration sodium hydroxide and potassium hydroxide having negative potential as a zeta potential. By conducting the CARE step on the mask blank glass substrate thus inhibited of minute concave defects and convex defects, projection regions present on the glass substrate principal surface are preferentially processed so that a mask blank glass substrate with extremely high-level smoothness can be obtained.

Moreover, by conducting physical cleaning before or after the CARE step, a mask blank glass substrate with an extremely high level smoothness below 0.08 nm at Rms and also with fewer defects can be obtained. Particularly, a significant effect is observed in a glass substrate with a multilayer reflective film having a multilayer reflective film and a protective film formed on a glass substrate principal surface, making it possible to significantly decrease the number of defects detected in high-sensitive defect inspection.

An explanation was made in Examples 3 and 4 regarding the case of employing a colloidal silica polishing liquid containing an additive and an alkali compound as a polishing liquid for use in polishing step, without limitation. A result similar to those of Examples 3 and 4 was achieved in the case where a chemically modified colloidal silica was used as a polishing grain for use in the polishing step.

Structures A-1 to A-8 below are set forth as a mask blank substrate fabrication method for obtaining a substrate with high-level smoothness and low-defect quality required as a mask blank substrate of the embodiments of Examples 3 and 4; Structures A-9 to A-10 as a fabrication method of a substrate with a multilayer reflective film and a mask blank of low defect and high quality with extremely reduced concave/convex defects caused by smoothness and surface defect of the substrate; and Structure A-11 as a fabrication method of a low defect, high quality transfer mask.

(Structure A-1)

A mask blank substrate fabrication method including a polishing step for polishing a principal surface of a mask blank substrate using a polishing liquid containing a loose abrasive, and a processing step including supplying a processing fluid to the principal surface obtained by the polishing step, in which the loose abrasive is a chemically modified colloidal silica, or the polishing liquid is a polishing liquid containing colloidal silica, an additive, and an alkali compound, and a Catalyst Referred Etching step in which a first processing fluid is supplied to the principal surface of the substrate in contact with the principal surface, with a catalytic face of a catalytic surface plate in contact or in close proximity to the principal surface, causing the substrate and the catalytic face to move relative to each other so as to subject the principal surface to Catalyst Referred Etching.

(Structure A-2)

A mask blank substrate fabrication method according to Structure A-1, in which the processing step supplying the processing fluid to the principal surface further includes a physical cleaning step for removing foreign matters attached to the principal surface using a physical action.

(Structure A-3)

A mask blank substrate fabrication method according to Structure A-2, wherein the physical cleaning step is conducted by supplying a second processing fluid to the principal surface.

(Structure A-4)

A mask blank substrate fabrication method according to Structure A-2 or A-3, wherein the physical cleaning step is conducted after the Catalyst Referred Etching step.

(Structure A-5)

A mask blank substrate fabrication method according to Structure A-2 or A-3, wherein the physical cleaning step is conducted before and after the Catalyst Referred Etching step.

(Structure A-6)

A mask blank substrate fabrication method according to Structure A-5, wherein the second processing fluid in the physical cleaning step conducted before the Catalyst Referred Etching step includes a chemical solution.

(Structure A-7)

A mask blank substrate fabrication method according to any one of Structure A-2 to Structure A-6, wherein a chemical cleaning step is conducted before the Catalyst Referred Etching step.

(Structure A-8)

A mask blank substrate fabrication method comprising a defect inspection step for conducting a defect inspection on a principal surface of a mask blank substrate obtained through the mask blank substrate fabrication method according to any one of Structure A-1 to Structure A-7.

(Structure A-9)

A fabrication method of a substrate with a multilayer reflective film, comprising forming a multilayer reflective film including a high refractive index layer and a low refractive index layer laminated alternately on a principal surface of a mask blank substrate obtained from the mask blank substrate fabrication method according to anyone of Structures A-1 to A-8.

(Structure A-10)

A fabrication method of a mask blank, wherein the mask blank is fabricated by forming a transfer pattern forming thin film on a principal surface of a mask blank substrate obtained from the mask blank substrate fabrication method according to any one of Structures A-1 to A-8, or on a substrate with a multilayer reflective film obtained from the fabrication method of Structure A-9.

(Structure A-11)

A fabrication method of a transfer mask, wherein the transfer pattern forming thin film of a mask blank obtained from the fabrication method of a mask blank according to Structure A-10 is patterned to form a transfer pattern on the principal surface.

INDUSTRIAL AVAILABILITY

While Examples 1 to 4 were explained using EUV exposure mask blank glass substrate as an example, this invention is not limited thereto, but substrates of other materials can be used, for example, a synthetic quartz glass substrate used in ArF excimer laser exposure.

Further, while Examples 1 to 4 were explained using an EUV exposure reflective mask blank and a reflective mask as examples, this invention is not limited thereto, but a transmissive mask blank as a mask blank, and a transmissive mask as a transfer mask can be used.

The transmissive mask blank is configured such that a light shielding film as a transfer pattern is formed on the principal surface of the side to which a transfer pattern of a mask blank substrate is formed. Transmissive mask blank includes binary mask blank and phase shift mask blank. The light shielding film includes a so-called half tone film that attenuates exposure light and causes phase shifting, in addition to a light shielding film functioning to shield exposure light.

A transmissive mask is configured such that the light shielding film of the transmissive mask blank is patterned so that a light shielding film pattern is formed on the mask blank substrate. When a binary mask is exposed with an exposure light of, e.g., ArF excimer laser light, the exposure light is shielded on the mask surface provided with a light shielding film, and on other portions where the light shielding film is removed, the light transmits through the exposed mask blank substrate, enabling its use as a transmissive mask for lithography. Further, when a half tone phase shift mask, which is a type of a phase shift mask, is exposed with an exposure light such as an ArF excimer laser light, the exposure light transmits through the exposed mask blank substrate in the portion on the mask surface where the light shielding film is removed, and in the portion provided with the light shielding film, the exposure light is transmitted in an attenuated condition and also having a predetermined phase shift amount, enabling its use as a transmissive mask for lithography. As a phase shift mask, not only the above-mentioned half tone phase shift mask, but phase shift masks using various phase shifting effects can be used, such as a Levenson phase shift mask.

The mask blank defect inspection device used in the defect inspection in Examples 1 to 4 and the comparative example is not limited thereto in this invention. For example, an evaluation can be made using a high sensitivity mask blank defect inspection device with an inspection light having wavelengths of 266 nm, 193 nm, and 13.5 nm.

REFERENCE NUMERALS

X support structure of the substrate by substrate support means
Y substrate
Y1 first principal surface
Y2 second principal surface
Y3 side face
Y4 chamfered face
Z vertical axis
1 mask blank substrate processing device
2 chamber
3 substrate support means
4 catalytic surface plate
4a catalytic face
5 relative movement means
6 first processing fluid supply means
7 physical cleaning means
8 second processing fluid supply means
9 small diameter portion
9a bottom
9b central hole
9c discharge channel
10 rotational axis
11 rotating body
12 bottom
13 peripheral wall
14 substrate support portion
14a upper face
15 substrate receiving portion
16 horizontal supporting face
17 vertical wall
17a finger receiving portion
17b recess
18 arm
19 rotational axis
20 pivot axis
21 supply tube
22 injection nozzle
23 brush cleaning means
24 megasonic cleaning means
25 pivot axis
26 arm
27 support axis
28 brush
29, 34 supply tube
30 injection nozzle
31 pivot axis
32 arm
33 megasonic nozzle
35 tapered supporting surface

The invention claimed is:

1. A mask blank substrate processing method including supplying a processing fluid to a mask blank substrate to process the mask blank substrate, the mask blank substrate processing method comprising:
   conducting a Catalyst Referred Etching, including supplying and contacting a first processing fluid to a principal surface of the substrate, and with a catalytic face of a catalytic surface plate in contact with the principal surface or in contact with the first processing fluid on the principal surface, causing the substrate and the catalytic face to move relative to each other so as to subject the principal surface to Catalyst Referred Etching; and
   after the Catalyst Referred Etching, conducting a physical cleaning for removing foreign matters attached to the principal surface using a physical action,
   wherein the substrate is a glass substrate,
   wherein the physical cleaning is at least one cleaning selected from the group consisting of megasonic cleaning and brush cleaning,
   wherein the physical cleaning is conducted by supplying a second processing fluid to the principal surface, and
   wherein the second processing fluid for the megasonic cleaning and the brush cleaning contains at least one selected from the group consisting of ozone water, hydrogen water, and neutral detergent.

2. The mask blank substrate processing method according to claim 1, wherein a chemical cleaning is conducted before the Catalyst Referred Etching.

3. The mask blank substrate processing method according to claim 1, wherein the first processing fluid is pure water, ozone water, or hydrogen water.

4. The mask blank substrate processing method according to claim 1, wherein the first processing fluid and the second processing fluid are the same processing fluid.

5. The mask blank substrate processing method according to claim 1, wherein an additional physical cleaning is conducted before the Catalyst Referred Etching.

6. The mask blank substrate processing method according to claim 5, wherein the additional physical cleaning is conducted by supplying a third processing fluid including a chemical solution to the principal surface.

7. The mask blank substrate processing method according to claim 1 wherein a mask blank is fabricated by forming a transfer pattern forming film on a principal surface of the mask blank substrate resulting in a mask blank.

8. The mask blank substrate processing method according to claim 7, further comprising:
   patterning the transfer pattern forming film of the mask blank to form a transfer pattern on the principal surface, resulting in a transfer mask.

9. The mask blank substrate processing method according to claim 1, wherein the physical cleaning at least comprises megasonic cleaning.

10. The mask blank substrate processing method according to claim 9, wherein the second processing fluid for the megasonic cleaning is hydrogen water.

11. The mask blank substrate processing method according to claim 1, wherein the physical cleaning at least comprises brush cleaning.

12. The mask blank substrate processing method according to claim 11, wherein the physical cleaning further comprises megasonic cleaning.

13. The mask blank substrate processing method according to claim 12, wherein the physical cleaning further comprises two fluid nozzle cleaning.

14. The mask blank substrate processing method according to claim 11, wherein the second processing fluid for the brush cleaning is neutral detergent.

15. The mask blank substrate processing method according to claim 14, wherein the physical cleaning further comprises megasonic cleaning, and wherein the second processing fluid for the megasonic cleaning is hydrogen water.

16. The mask blank substrate processing method according to claim 15, wherein the physical cleaning is conducted by the brush cleaning, the megasonic cleaning, and two fluid nozzle cleaning in this sequence.

17. A fabrication method of a substrate with a multilayer reflective film, comprising:
   conducting a Catalyst Referred Etching, including supplying and contacting a first processing fluid to a principal surface of the substrate, and with a catalytic face of a catalytic surface plate in contact with the principal surface or in contact with the first processing fluid on the principal surface, causing the substrate and the catalytic face to move relative to each other so as to subject the principal surface to Catalyst Referred Etching; and
   after the Catalyst Referred Etching, conducting a physical cleaning for removing foreign matters attached to the principal surface using a physical action,
   wherein the substrate is a glass substrate,
   wherein the physical cleaning is at least one cleaning selected from the group consisting of megasonic cleaning and brush cleaning,
   wherein the physical cleaning is conducted by supplying a second processing fluid to the principal surface, and
   wherein the second processing fluid for the megasonic cleaning and the brush cleaning contains at least one selected from the group consisting of ozone water, hydrogen water, and neutral detergent; and
   forming a multilayer reflective film including a first layer with a first refractive index and a second layer with a second refractive index lower than the first refractive index laminated alternately on a principal surface of the mask blank substrate,
   wherein the multilayer reflective film is formed by an ion beam sputtering using a target of a first material for the first refractive index and a second material for the second refractive index by allowing sputter particles of the first material and the second material to enter at an incident angle between 0 and 30 degrees, both inclusive, with respect to a normal line of the principal surface.

18. The method of claim 17, wherein a mask blank is fabricated by forming a transfer pattern forming film on the substrate with the multilayer reflective film.

19. The method of claim 18, wherein a transfer mask is fabricated by
   patterning to form a transfer pattern on the principal surface.

* * * * *